US011699659B2

(12) United States Patent
Wang et al.

(10) Patent No.: US 11,699,659 B2
(45) Date of Patent: *Jul. 11, 2023

(54) STAIRCASE STRUCTURE IN THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Di Wang, Wuhan (CN); Wenxi Zhou, Wuhan (CN); Zhiliang Xia, Wuhan (CN); Zhong Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/534,312

(22) Filed: Nov. 23, 2021

(65) Prior Publication Data

US 2022/0084944 A1    Mar. 17, 2022

Related U.S. Application Data

(63) Continuation of application No. 16/944,857, filed on Jul. 31, 2020, now Pat. No. 11,233,007, which is a
(Continued)

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76816* (2013.01); *H01L 21/76825* (2013.01);
(Continued)

(58) Field of Classification Search
None
See application file for complete search history.

(56) References Cited

U.S. PATENT DOCUMENTS

| 8,999,844 B2 | 4/2015 | Freeman et al. |
| 9,029,938 B2 | 5/2015 | Nakaki |

(Continued)

FOREIGN PATENT DOCUMENTS

| CN | 107293532 A | 10/2017 |
| CN | 107731845 A | 2/2018 |

(Continued)

OTHER PUBLICATIONS

Extended European Search Report issued in corresponding European Application No. EP 20 92 2502.8, dated Jul. 6, 2022, 9 pages.
(Continued)

*Primary Examiner* — Hsien Ming Lee
(74) *Attorney, Agent, or Firm* — Bayes PLLC

(57) ABSTRACT

In an example of the present disclosure, 3D memory device includes a memory array structure and a staircase structure dividing the memory array structure into a first memory array structure and a second memory array structure along a lateral direction. The staircase structure includes a plurality of stairs, and a bridge structure in contact with the first memory array structure and the second memory array structure. A stair of the plurality of stairs includes a conductor portion on a top surface of the stair and electrically connected to the bridge structure, and a dielectric portion at a same level and in contact with the conductor portion. The stair is electrically connected to at least one of the first memory array structure and the second memory array structure. The conductor portion includes a portion overlapping with an immediately-upper stair and in contact with the dielectric portion and the bridge structure.

20 Claims, 14 Drawing Sheets

Related U.S. Application Data continuation of application No. PCT/CN2020/094649, filed on Jun. 5, 2020.

(51) Int. Cl.
| | | |
|---|---|---|
| *H01L 23/522* | (2006.01) | |
| *H10B 41/10* | (2023.01) | |
| *H10B 41/27* | (2023.01) | |
| *H10B 41/35* | (2023.01) | |
| *H10B 43/10* | (2023.01) | |
| *H10B 43/27* | (2023.01) | |
| *H10B 43/35* | (2023.01) | |

(52) U.S. Cl.
CPC .... *H01L 21/76877* (2013.01); *H01L 23/5226* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(56) References Cited

U.S. PATENT DOCUMENTS

| | | | |
|---|---|---|---|
| 10,224,240 | B1 | 3/2019 | Funayama et al. |
| 11,233,007 | B2 * | 1/2022 | Wang ............... H01L 27/11519 |
| 2015/0064900 | A1 | 3/2015 | Lee et al. |
| 2015/0255385 | A1 | 9/2015 | Lee et al. |
| 2019/0081072 | A1 | 3/2019 | Chun et al. |
| 2020/0020714 | A1 | 1/2020 | Oh |
| 2020/0105783 | A1 | 4/2020 | Baek |
| 2021/0193676 | A1 | 6/2021 | Zhang et al. |

FOREIGN PATENT DOCUMENTS

| | | | |
|---|---|---|---|
| CN | 107768377 | A | 3/2018 |
| CN | 108231786 | A | 6/2018 |
| CN | 108428703 | A | 8/2018 |
| CN | 109309095 | A | 2/2019 |
| CN | 109754836 | A | 5/2019 |
| CN | 110391242 | A | 10/2019 |
| CN | 110391248 | A | 10/2019 |
| CN | 110718553 | A | 1/2020 |
| CN | 110797345 | A | 2/2020 |
| CN | 111033729 | A | 4/2020 |
| TW | 201605015 | A | 2/2016 |
| TW | 201834217 | A | 9/2018 |

OTHER PUBLICATIONS

International Search Report issued in corresponding International Application No. PCT/CN2020/094649, dated Jan. 27, 2021, 5 pages.

International Search Report issued in corresponding International Application No. PCT/CN2020/094658, dated Jan. 27, 2021, 5 pages.

Communication pursuant to Article 94(3) EPC issued in corresponding European Application No. EP 20 92 2502.8, dated Apr. 21, 2023, 8 pages.

* cited by examiner

100

200

STAIRCASE STRUCTURE IN THREE-DIMENSIONAL MEMORY DEVICE AND METHOD FOR FORMING THE SAME

CROSS-REFERENCE TO RELATED APPLICATIONS

This application is a continuation of U.S. application Ser. No. 16/944,857, filed on Jul. 31, 2020, entitled "STAIRCASE STRUCTURE IN THREE-DIMENSIONAL MEMORY DEVICE AND METHOD FOR FORMING THE SAME," which is a continuation of International Application No. PCT/CN2020/094649, filed on Jun. 5, 2020, entitled "STAIRCASE STRUCTURE IN THREE-DIMENSIONAL MEMORY DEVICE AND METHOD FOR FORMING THE SAME," both of which are hereby incorporated by reference in their entireties. This application is also related to U.S. application Ser. No. 16/944,835, filed on Jul. 31, 2020, entitled "STAIRCASE STRUCTURE IN THREE-DIMENSIONAL MEMORY DEVICE AND METHOD FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices having staircase structures and methods for forming the same are disclosed herein.

In one example, the 3D memory device includes a memory array structure and a staircase structure. The staircase structure is located in an intermediate of the memory array structure and divides the memory array structure into a first memory array structure and a second memory array structure along a lateral direction. The staircase structure includes a plurality of stairs extending along the lateral direction, and a bridge structure in contact with the first memory array structure and the second memory array structure. The plurality of stairs includes a stair above one or more dielectric pairs. The stair includes a conductor portion on a top surface of the stair and in contact with and electrically connected to the bridge structure, and a dielectric portion at a same level and in contact with the conductor portion. The stair is electrically connected to at least one of the first memory array structure and the second memory array structure through the bridge structure. Along a second lateral direction perpendicular to the lateral direction and away from the bridge structure, a width of the conductor portion decreases.

In another example, the 3D memory device includes a memory array structure and a landing structure in contact with the memory array structure. The landing structure includes a plurality of landing areas each at a respective depth extending along a lateral direction, and a bridge structure in contact with the memory array structure. The plurality of landing areas each includes a conductor portion on a respective top surface and a dielectric portion at a same level and in contact with the conductor portion. The conductor portion is electrically connected to the memory array structure through the bridge structure. A width of the conductor portion decreases along a second lateral direction perpendicular to the lateral direction and away from the bridge structure. The plurality of landing areas are each above one or more dielectric pairs.

In still another example, the 3D memory device includes a memory array structure and a staircase structure. The staircase structure includes a plurality of stairs extending along a lateral direction. The plurality of stairs includes a stair having a conductor portion on a top surface of the stair and a dielectric portion at a same level and in contact with the conductor portion. The conduction portion is electrically connected to the memory array structure. Along a second lateral direction perpendicular to the lateral direction, a width of the conductor portion varies.

In still another example, a method for forming a staircase structure of 3D memory device includes the following operations. First, a plurality of stairs are formed having interleaved a plurality of first sacrificial layers and a plurality of first dielectric layers in a plurality of stairs. A bridge structure is formed in contact with the plurality of stairs, the bridge structure having interleaved a plurality of second sacrificial layers and a plurality of second dielectric layers. Each first sacrificial layer is in contact with a respective second sacrificial layer of the same level, and each first dielectric layer is in contact with a respective second dielectric layer of the same level. A sacrificial portion is formed in the first sacrificial layer corresponding to at least one of the stairs. The sacrificial portion is at a top surface of the respective stair and being cut off at an edge of an upper stair. The second sacrificial layers and the sacrificial portion are removed by a same etching process to respectively form a plurality of lateral recesses and a lateral recess portion. A plurality of conductor layers are formed in the lateral recesses and a conductor portion is formed in the lateral recess portion and in contact with a respective one of the conductor layers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
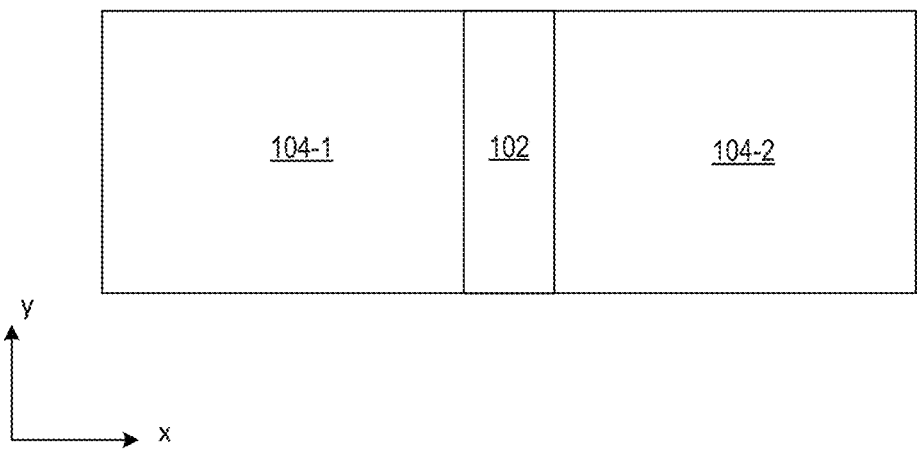
FIG. 1A illustrates a schematic diagram of an exemplary 3D memory device having staircase structures, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (VIA) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, memory cells for storing data are vertically stacked through a stacked storage structure (e.g., a memory stack). 3D memory devices usually include staircase structures formed in the vicinity of the stacked storage structure for purposes such as word line fan-out. As the demand for higher storage capacity continues to increase, the number of vertical levels of the stacked storage structure also increases, and it has become more difficult to form the word line VIA contacts on the stairs without punching through the contacts and causing short circuits. For example, the word line VIA contacts are often formed by forming openings in contact with the stairs (e.g., the landing area of the stairs) in an insulating structure in which the staircase structure is placed, and filling the openings with a conductive material. Conventionally, these openings, formed to be in contact with stairs at different depths/heights, are formed in the same etching process. Because of the variation in opening depths, the openings are often not etched evenly or desirably. For example, the openings in contact with lower stairs (e.g., the deeper openings) and the openings in contact with higher stairs (e.g., the shallower openings) undergo the same etching time, resulting the openings in contact with the higher stairs to be over etched. The over-etching can cause the conductor layers (e.g., word lines) on the top surfaces of the higher stairs to be undesirably damaged or even etched through. The word line VIA contacts can undesirably be in contact with other conductor layers underlying the respective conductor layers, causing a punch-through that leads to short circuits or undesirable leakage. To solve this issue, efforts, such as thickening the conductor layer for landing, have been made. However, a thicker landing area still cannot desirably reduce the possibility of punch-through, and the fabrication process becomes more challenging.

Various embodiments in accordance with the present disclosure provide staircase structures and fabrication methods thereof. A staircase structure, having a plurality of stairs, can include a conductor portion at the top surface of at least one stair and a dielectric structure, including one or more dielectric pairs, under the conductor portion. The conductor portion covers at least the landing area of the respective stair (e.g., a portion of the stair) such that a word line VIA contact can be in contact with and electrically connected to the respective stair. The thickness of the dielectric structure can be equal to the distance from the bottom surface of the conductor portion to the top surface of the substrate and is desirably thick to prevent interference between conductor portions at different stairs due to punch-through. Along the lateral direction that is perpendicular to the direction the stairs extend, a width of each conductor portion may decrease gradually from an end.

In embodiments of the present disclosure, the conductor portion includes an overlapping portion and a non-overlapping portion. The overlapping portions refer to the portions of the conductor portion that overlap with an immediately-above and/or an immediately-below stair (or the conductor portion of the immediately-above/immediately-below stair). The non-overlapping portion refers to the portion of the conductor portion not overlapping with an upper or a lower stair. A word line VIA contact can be formed on the non-overlapping portion of the conductor portion. The non-overlapping portion of the conductor portion can have a desirably large landing area for the respective word line VIA contact to be formed on. In some embodiments, along the direction the stairs extend, the dimension of the non-overlapping portion of the conductor portion becomes nominally the same as the dimension of the stair.

In some embodiments, over the dielectric structure under the conductor portion includes a respective dielectric layer and one or more underlying dielectric pairs, each including a dielectric portion and a dielectric layer in a lower stair. In some embodiments, the number of dielectric pairs under the conductor portion of a respective stair is equal to the number of stairs/levels under the stair. Even if a punch-through occurs on any conductor portion, the word line VIA contact has no contact on the conductor portion (or word line) of any lower stairs, and leakage or short circuits can be reduced/eliminated. It might then be less difficult to form the openings.

In various embodiments, the stairs are formed in a staircase structure that is located at the intermediate of memory array structures or on the side of a memory array structure. The staircase structure can include a bridge structure that has interleaved a plurality of conductor layers and dielectric layers. The conductor layers are conductively connected to the memory cells in the memory array structure(s). The conductor portions of each stair can be in contact with a conductor layer at the same level along a direction perpendicular to the direction the stairs extend such that voltages can be applied to the memory cells through the conductor portions and the conductor layers at the same levels.

To form the conductor portion, an ion implantation process is performed before the gate-replacement. The ion implantation process is employed to form a sacrificial portion, which is an ion-implantation-treated portion of the respective sacrificial layer at the top surface of the stair. The ion implantation process can alter the physical properties of the treated portion such that the sacrificial portion can be etched at a higher rate than other parts of the sacrificial layer that are not treated with the ion implantation. One etching process can then be applied to remove the sacrificial layers (e.g., for forming word lines in the bridge structure) and the sacrificial portions simultaneously, such that lateral recesses and lateral recess portions can be formed. The dielectric structure under the sacrificial portion can be retained. In some embodiments, the lateral recess portion includes an over-etched portion of the sacrificial layer under the immediately-above stair due to the higher etch rate on the sacrificial portion. A conductor material is deposited to fill the lateral recess portion at each stair and lateral recesses in the bridge structure. A plurality of conductor layers can be formed in the bridge structure. A plurality of conductor portions, each at a respective stair and over a respective dielectric structure, can be formed in the staircase. In some embodiments, the over-etched portion, after being filled with the conductor portion, forms the overlapping portion between adjacent conductor portions.

Figure 1B:
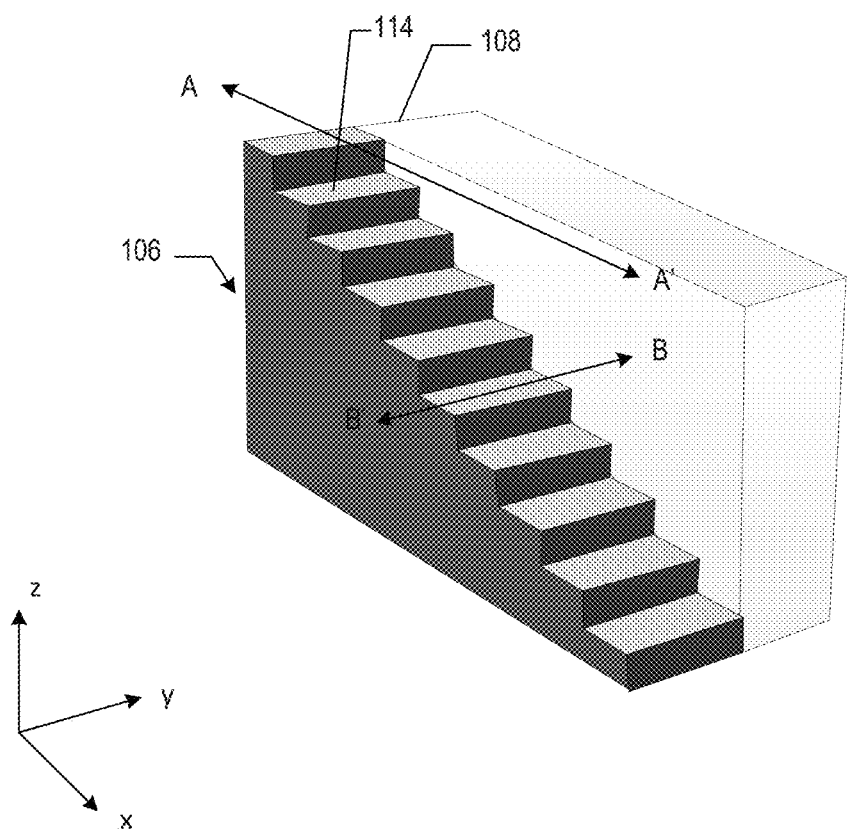
FIG. 1B illustrates a top front perspective view of an exemplary staircase structure of a 3D memory device shown in FIG. 1A, according to some embodiments of the present disclosure.
Figure 1C:
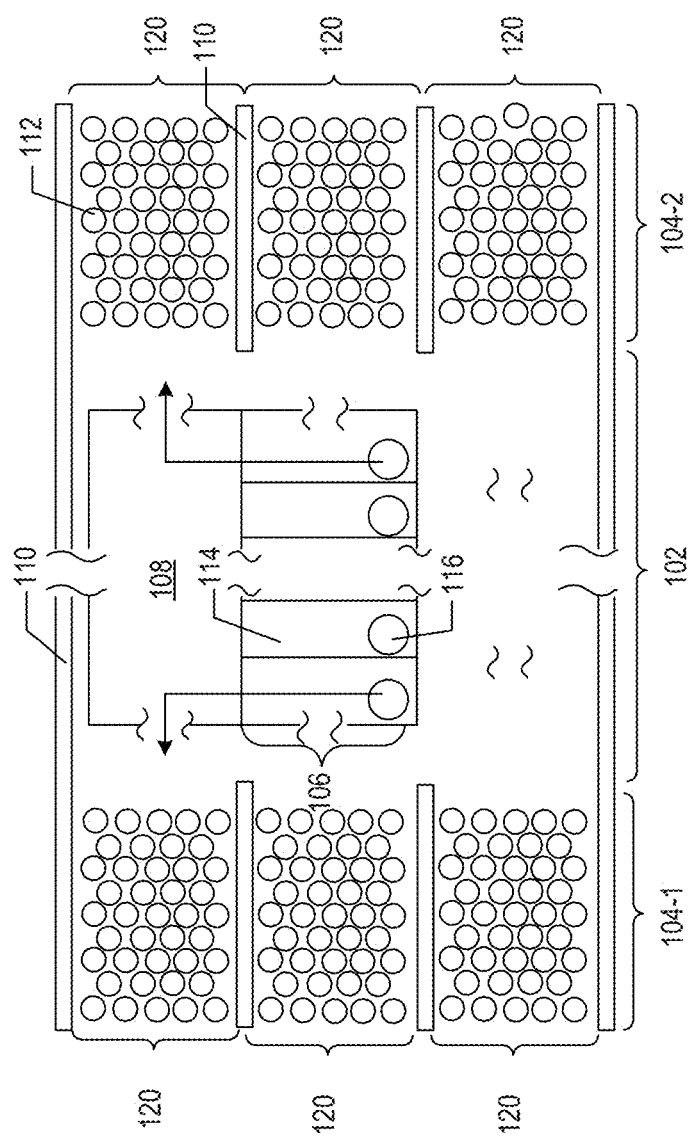
FIG. 1C illustrates a plan view of an exemplary 3D memory device shown in FIG. 1A, according to some embodiments of the present disclosure.
Figure 2A:
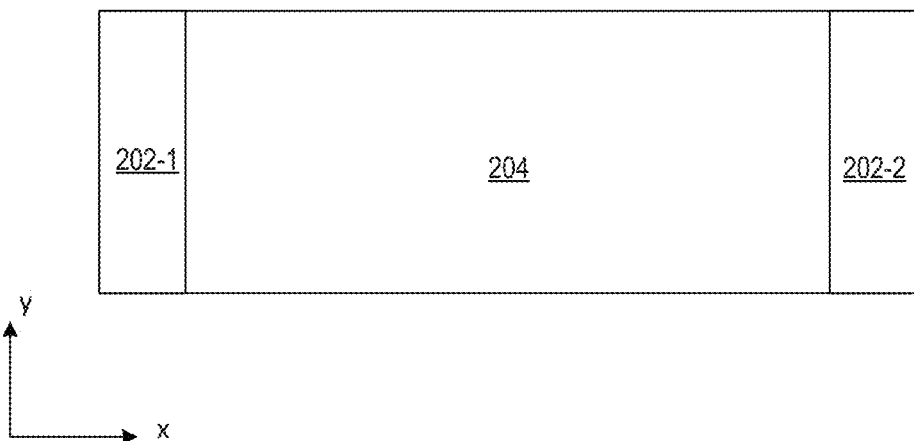
FIG. 2A illustrates a schematic diagram of another exemplary 3D memory device having staircase structures, according to some embodiments of the present disclosure.
Figure 2B:
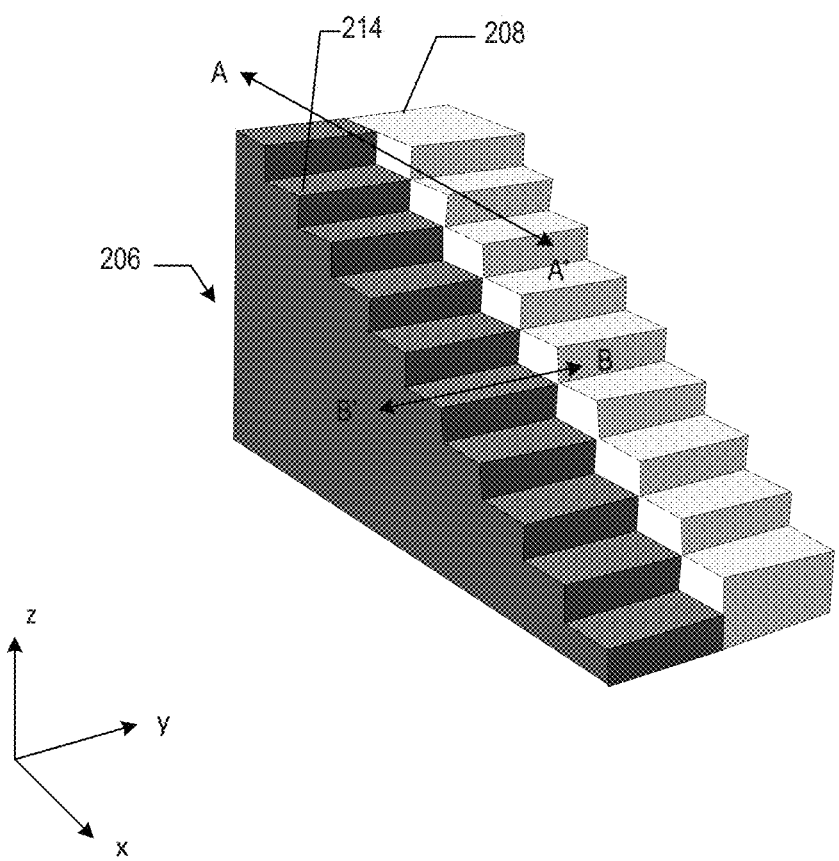
FIG. 2B illustrates a top front perspective view of an exemplary staircase structure of a 3D memory device shown in FIG. 2A, according to some embodiments of the present disclosure.
Figure 2C:
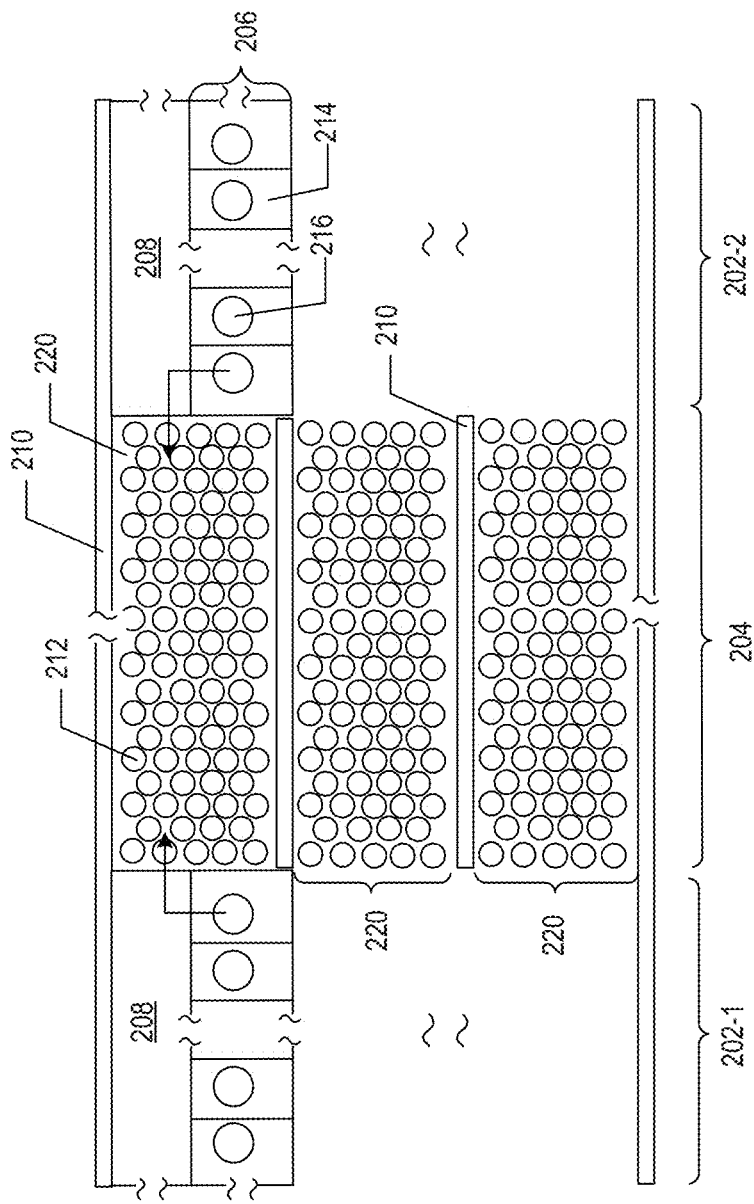
FIG. 2C illustrates a plan view of an exemplary 3D memory device shown in FIG. 2A, according to some embodiments of the present disclosure.

FIGS. 1A-1C and FIGS. 2A-2C illustrate schematic views of 3D memory devices 100 and 200 respectively having a staircase structure, according to some embodiments. Specifically, FIGS. 1A-1C illustrate a layout in which the staircase structure is located at the intermediate of a memory plane, and FIGS. 2A-2C illustrate a layout in which the staircases are located on the two sides of a memory plane.

The staircase structure of the present disclosure can be formed in both 3D memory devices 100 and 200. As an example to explain the present disclosure, embodiments focus on the structure and fabrication process of the staircase structure in 3D memory device 100. In some embodiments, the staircase structures in 3D memory device 200 may be formed in a similar fabrication process. It is noted that x and y axes are included in FIGS. 1A and 2A to illustrate two orthogonal (perpendicular) directions in the wafer plane. The x-direction is the word line direction of the respective 3D memory device, and the y-direction is the bit line direction of the respective 3D memory device. It should be noted that the structures in the present disclosure are merely for illustration purposes only and thus, do not indicate the dimensions, ratios, or shapes in actual products.

FIG. 1A illustrates a schematic diagram of an exemplary 3D memory device 100 having a staircase structure 102, according to some embodiments of the present disclosure. In some embodiments, 3D memory device 100 includes multiple memory planes. A memory plane can include a first memory array structure 104-1, a second memory array structure 104-2, and a staircase structure 102 in the intermediate of first and second memory array structures 104-1 and 104-2. First and second memory array structures 104-1 and 104-2, together regarded as a memory array structure, may or may not have the same area. In some embodiments, staircase structure 102 is in the middle of first and second memory array structures 104-1 and 104-2. For example, first and second memory array structures 104-1 and 104-2 may be symmetric in the x-direction with respect to staircase structure 102. It is understood that in some examples, staircase structure 102 may be in the intermediate, but not in the middle (center), of first and second memory array structures 104-1/104-2, such that first and second memory array structures 104-1 and 104-2 may have different sizes and/or numbers of memory cells. In some embodiments, 3D memory device 100 is a NAND Flash memory device in which memory cells are provided in the form of an array of NAND memory strings (not shown in FIG. 1A) in first and second memory array structures 104-1 and 104-2. First and second memory array structures 104-1 and 104-2 can include any other suitable components including, but not limited to, gate line slits (GLSs), through array contacts (TACs), array common sources (ACSs), etc.

Each word line (not shown in FIG. 1A) of the memory plane extending laterally in the x-direction can be separated by staircase structure 102 into two parts: a first word line part across first memory array structure 104-1, and a second word line part across second memory array structure 104-2. The two parts of each word line can be electrically connected by a bridge structure (shown as bridge structure 108 in staircase structure 102 in FIGS. 1B and 1C) at a respective stair in staircase structure 102. A row decoder (not shown) can be formed right above, below, or in proximity to respective staircase structure 102. Each row decoder can bilaterally drive word lines in opposite directions from the intermediate of the memory plane.

The detailed structure of staircase structure 102 is illustrated in FIGS. 1B and 1C. FIG. 1B illustrates a top front view of staircase structure 102 in 3D memory device 100. FIG. 1C illustrates a top view of staircase structure 102 and its spatial relationship with adjacent first and second memory array structures 104-1 and 104-2. For ease of illustration, FIG. 1C only depicts one staircase structure 102. In various embodiments, 3D memory device 100 includes a plurality of staircase structures between first and second memory array structures 104-1 and 104-2, e.g., aligned with staircase structure 102 along they-direction. For example, another staircase structure may be the same as staircase structure 102 and mirror staircase structure 102 along the y-direction. Also, other possible structures such as dummy staircases are omitted in staircase structure 102 for ease of illustration.

FIG. 1B depicts staircase structure 102 having a staircase 106 and a bridge structure 108, in contact with each other. FIG. 1E illustrates a detailed 3D perspective view of staircase structure 102. Staircase structure 102 may be on a substrate 10 (shown in FIG. 1D), which can include silicon (e.g., single crystalline silicon), silicon germanium (SiGe), gallium arsenide (GaAs), germanium (Ge), silicon on insulator (SOI), or any other suitable materials.

Staircase 106 may include a plurality of stairs 114 extending along the word line direction, e.g., the x-direction. Each stair 114 may have a different depth along the z-direction and a landing area, e.g., for forming contact with a corresponding word line VIA contact. Each stair 114 (as shown as a "level") of staircase 106 can include one or more material layer pairs. In some embodiments, the top material layer of each stair 114 includes a conductor portion for interconnection with a word line VIA contact in the vertical direction. In some embodiments, every two adjacent stairs 114 of staircase 106 are offset by a nominally same distance in the z-direction and a nominally same distance in the x-direction. Each offset thus can form a "landing area" for interconnection with word line contacts of the 3D memory device in the z-direction direction. In some embodiments, each stair 114 includes at least one dielectric layer under the conductor portion.

Bridge structure 108 can include vertically interleaved conductor layers and dielectric layers (not shown), and the conductor layers (e.g., metal layers or polysilicon layers) can function as part of word lines. Different from staircase 106 in which the word lines therein are cut off from the memory array structure (e.g., 104-1 and/or 104-2) in the x-direction (e.g., in the positive x-direction, the negative x-direction, or both), the word lines in bridge structure 108 can be preserved to bridge the word line VIA contacts landed on stairs 114 and the memory array structures (e.g., 104-1 and/or 104-2) in order to achieve the bilateral word line-driving scheme. In some embodiments, at least one stair 114 in a staircase in staircase 106 is electrically connected to at least one of the first memory array structure 104-1 and the second memory array structure 104-2 through bridge structure 108. At least one word line can extend laterally in the memory array structure (e.g., 104-1 and/or 104-2) and bridge structure 108, such that the at least one stair 114 can be electrically connected to the at least one of the first and second memory array structures (e.g., 104-1 and/or 104-2) through bridge structure 108 by the at least one word line. In one example, a stair 114 in staircase 106 may be electrically connected to first memory array structure 104-1 (in the negative x-direction) by a respective word line part extending in the negative x-direction through bridge structure 108. In some embodiments, the at least one stair 114 in staircase 106 is electrically connected to each of first memory array structure 104-1 and second memory array structure 104-2 through bridge structure 108, e.g., by the respective word line parts extending in the negative and positive x-directions, respectively.

The conductor portion in staircase 106 and conductive layers in bridge structure 108 can each include conductive materials including, but not limited to, tungsten (W), cobalt (Co), copper (Cu), aluminum (Al), polycrystalline silicon (polysilicon), doped silicon, silicides, or any combination thereof. The dielectric layers in staircase 106 and bridge structure 108 can include dielectric materials including, but not limited to, silicon oxide, silicon nitride, silicon oxynitride, or any combination thereof. In some embodiments, the conductor portions and conductor layers include the same material, e.g., metals, such as tungsten, and the dielectric layers include the same material, such as silicon oxide.

Figure 1D:
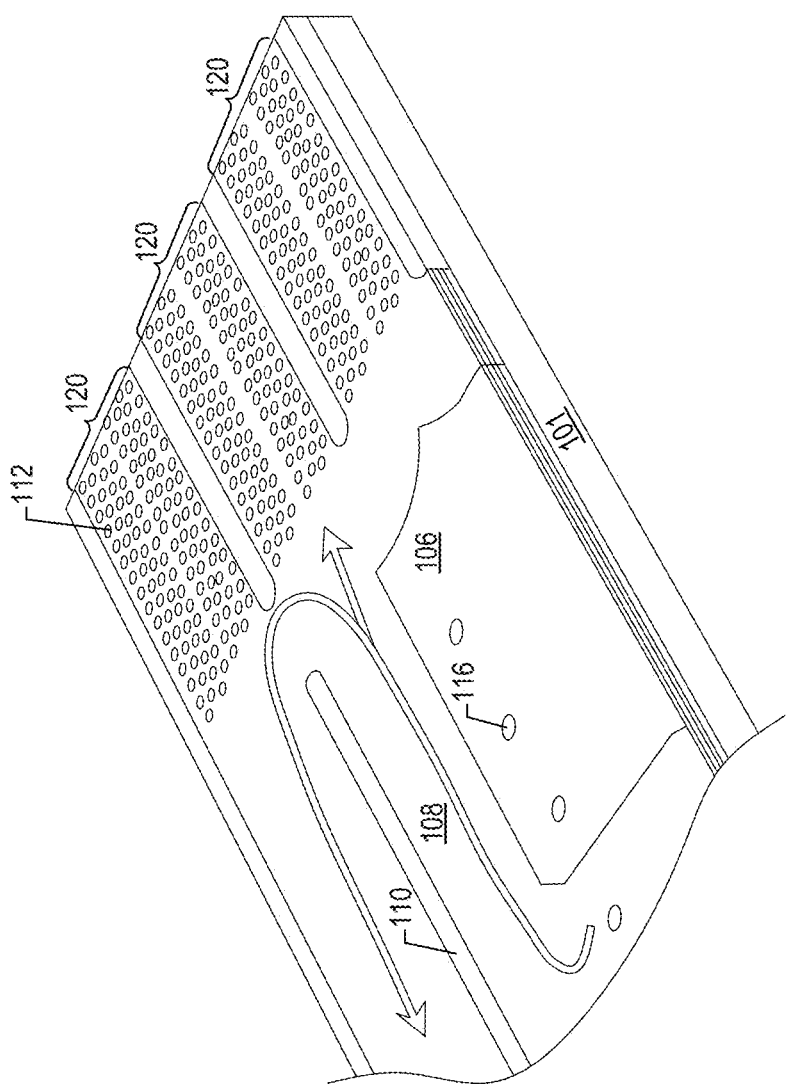
FIG. 1D illustrates another plan view of an exemplary 3D memory device shown in FIG. 1A, according to some embodiments of the present disclosure.
Figure 1E:
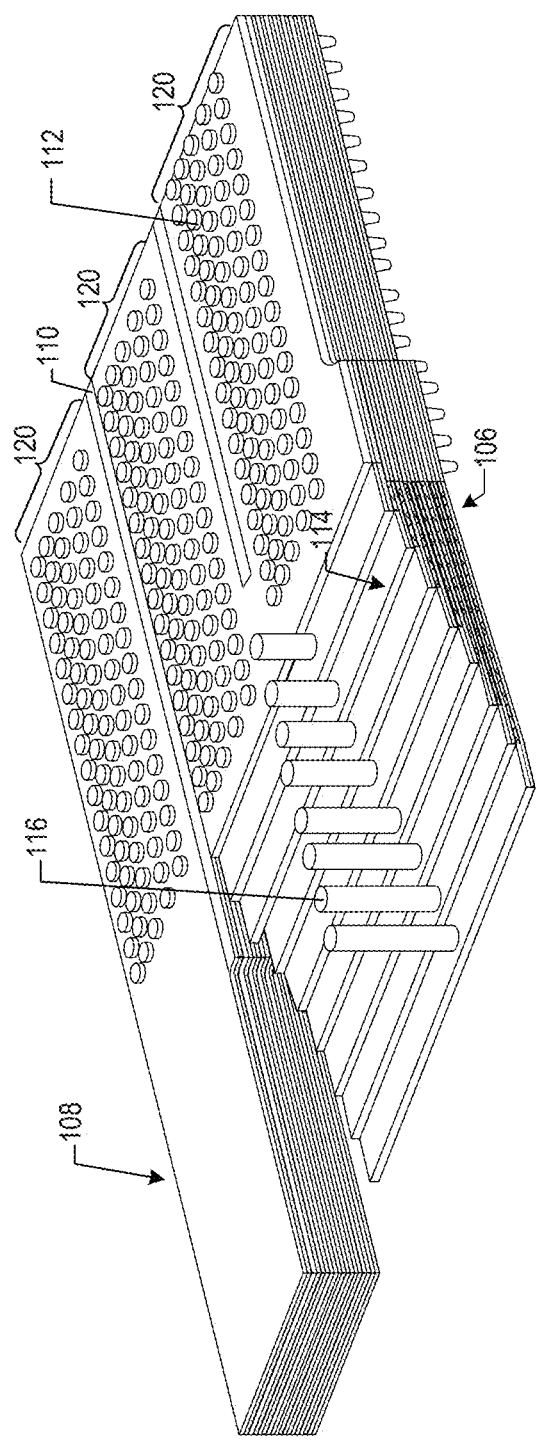
FIG. 1E illustrates a detailed top front perspective view of an exemplary staircase structure of a 3D memory device shown in FIG. 1A, according to some embodiments of the present disclosure.

FIGS. 1C and 1D illustrate staircase structure 102 between first and second memory array structures 104-1 and 104-2. As shown in FIGS. 1C and 1D, staircase 106 may include a plurality of stairs 114 extending along the x-direction, and a word line VIA contact 116 is formed on at least one (e.g., each) stair 114. Each of first and second memory array structures 104-1 and 104-2 may include one or more memory blocks, and each memory block includes one or more memory fingers 120. In some embodiments, staircase structure 102 may be between a pair of memory fingers 120 along the y-direction. Each memory finger 120 may include a plurality of memory strings 112 extending along the z-direction. Memory string 112 may include a channel structure that has a blocking layer, a memory layer, a tunneling layer, a semiconductor layer, and optionally, a dielectric core in a channel hole and arranged radially from the sidewall towards the center of the channel hole. Memory strings 112 may intersect with a plurality of word lines (e.g., conductor layers in memory fingers 120), forming a plurality of memory cells. The memory cells may form a memory cell array in the respective memory array structure. In some embodiments, GLSs 110, extending along the x-direction and the z-direction, divides memory cells in first and second memory array structures 104-1 and 104-2 into a plurality of memory fingers 120 along the y-direction.

To achieve the bilateral word line-driving scheme, bridge structure 108 connects (both physically and electrically) first memory array structure 104-1 and/or second memory array structure 104-2, according to some embodiments. That is, staircase structure 102 does not completely cut off the memory array structure in the intermediate, but instead leaves the first and second memory array structures 104-1 and 104-2 connected by bridge structure 108 thereof, according to some embodiments. Each word line thus can be bilaterally driven (in both positive and negative x-directions) from a respective word line VIA contact 116 in the intermediate of 3D memory device 100 through bridge structures 108. FIGS. 1C and 1D illustrate exemplary current paths of the bilateral word line-driving scheme with staircase structures 102. Current paths indicated by the arrows represent currents passing through separate word lines at different levels, respectively.

FIGS. 2A-2C illustrates a schematic diagram of a 3D memory device 200 having staircase structures 202-1 and 202-2 each on a respective side of a memory array structure 204. Staircase structures 202-1 and 202-2, and memory array structure 204 may be on a substrate 101, similar to that in 3D memory device 100. 3D memory device 200 may include a memory plane that has a memory cell array in a memory array structure 204. Different from 3D memory device 100, 3D memory device 200 includes two staircase structures 202-1 and 202-2 at opposite sides in the x-direction of memory array structure 204. Each word line of the memory plane extends laterally in the x-direction across the entire memory plane to a respective stair (level) in staircase structure 202-1 or 202-2. A row decoder (not shown) is formed right above, below, or in proximity to the respective staircase structure. That is, each row decoder unilaterally (either in the positive or negative x-direction, but not both) drives one-half of the memory cells through one-half of the word lines, each of which crosses the entire memory plane.

Staircase structure 202-1 and 202-2 may have similar/ same structures. FIG. 2B illustrates a front top view of a staircase structure that can represent each of staircase structures 202-1 and 202-2. The staircase structure may include a staircase 206 that has a plurality of stairs 214 extending along the x-direction, similar to staircase 106. The staircase structure also includes a bridge structure 208 electrically and physically connected to staircase 206. Bridge structure 208 may include interleaved conductor layers and dielectric layers, similar to that bridge structure 108. In some embodiments, bridge structure 208 includes a plurality of stairs extending along the x-direction, each of the stairs corresponding to a respective stair of staircase 206. Staircase 206 may be similar to staircase 106, e.g., at least one stair 214 includes a conductor portion at the top surface and electrically connected to a conductor layer at the same level in bridge structure 208. Conductor layers in bridge structure 208 may be word line parts that are electrically connected to word lines (e.g., conductor layers) in memory array structure 204.

FIG. 2C illustrates staircase structures 202-1 and 202-2 each on a respective side of memory array structure 204. As shown in FIG. 2C, staircase 206 may include a plurality of stairs 214 extending along the x-direction, and a word line VIA contact 216 is formed on at least one (e.g., each) stair 214. Memory array structures 204 may include one or more memory blocks, and each memory block includes one or more memory fingers 220. Each memory finger 220 may include a plurality of memory strings 212, similar to memory strings 112 in 3D memory device 200. Memory strings 212 may intersect with a plurality of word lines (e.g., conductor layers in memory fingers 220), forming a plurality of memory cells, which form a memory cell array in the respective memory array structure. In some embodiments, GLSs 210, extending along the x-direction and the z-direction, divides memory cells in memory array structure 204 into a plurality of memory fingers 220 along the y-direction.

To achieve the unilateral word line-driving scheme, bridge structures 208 each connects (both physically and electrically) memory array structure 204, according to some embodiments. Each word line thus can be unilaterally driven (in positive or negative x-direction) from a respective word line VIA contact 216 on one side of 3D memory device 200 through bridge structures 208. As shown in FIG. 2C, current paths indicated by the arrows represent currents passing through two separate word lines at different levels, respectively.

Figure 3A:
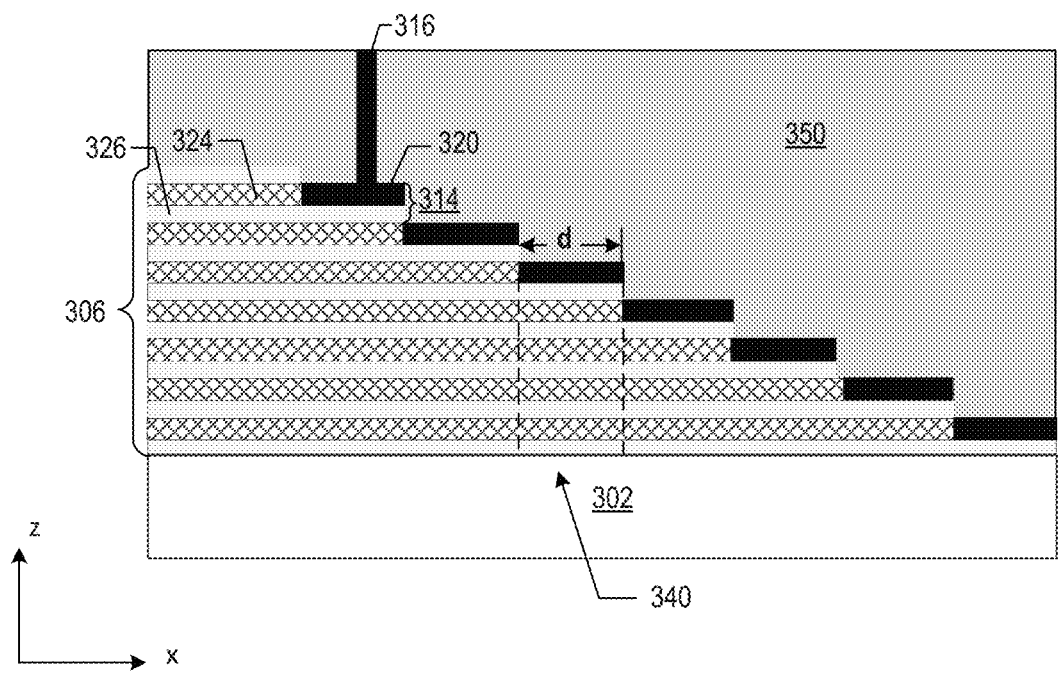
FIG. 3A illustrates a cross-sectional view of an exemplary 3D memory device having a staircase structure, according to some embodiments of the present disclosure.
Figure 3B:
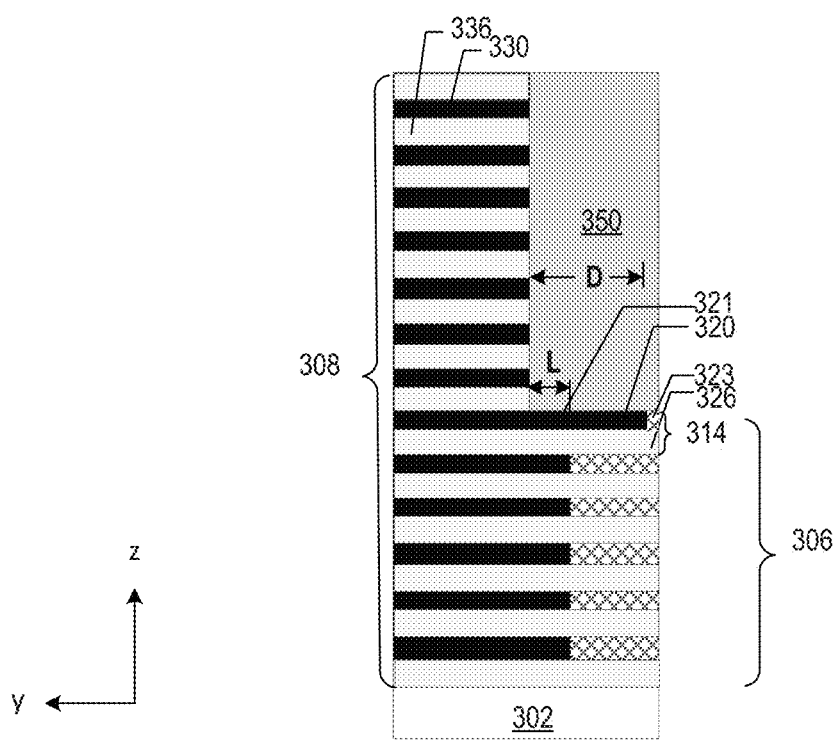
FIG. 3B illustrates another cross-sectional view of the 3D memory device shown in FIG. 3A, according to some embodiments of the present disclosure.
Figure 3C:
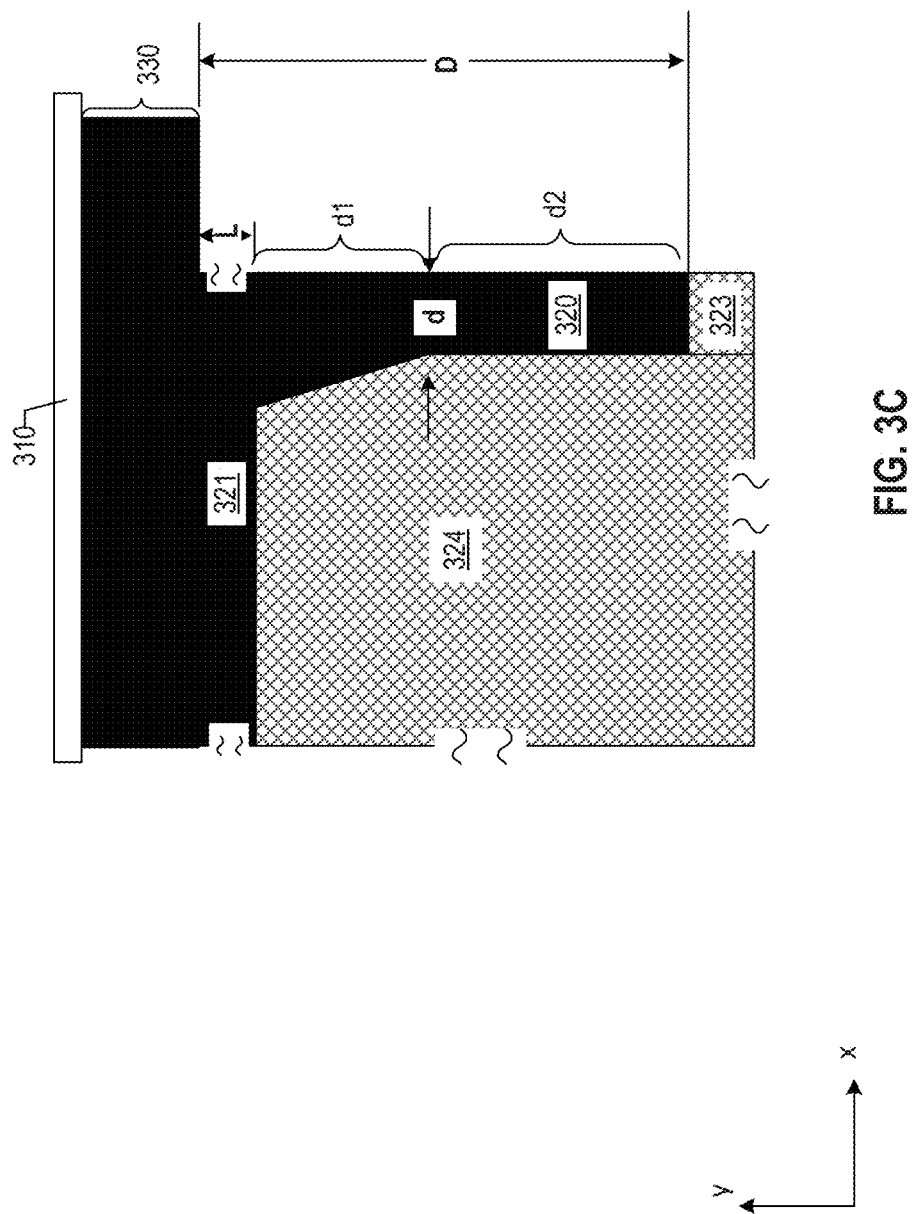
FIG. 3C illustrates another cross-sectional view of the 3D memory device shown in FIG. 3A, according to some embodiments of the present disclosure.
Figure 3D:
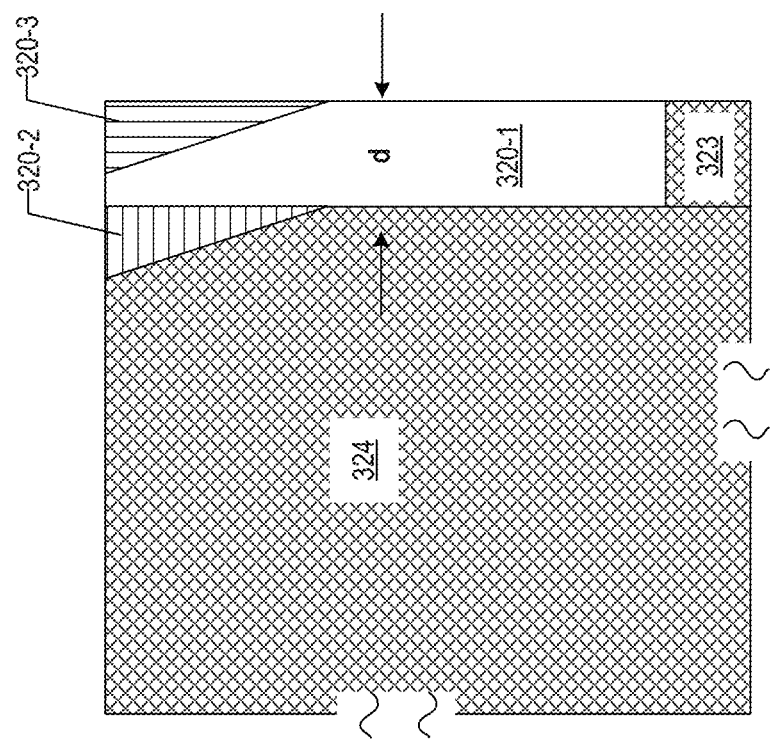
FIG. 3D illustrates a detailed cross-section view of a conductor portion shown in FIG. 3C, according to some embodiments of the present disclosure.

FIGS. 3A-3D illustrates three cross-sectional views of a staircase structure (e.g., 102), each being orthogonal of one another. Specifically, FIGS. 3A and 3B respectively depict cross-sectional views of staircase structure 102 along the A-A' and the B-B' directions, as shown in FIG. 1B. FIG. 3A illustrates the cross-sectional view of the staircase 106, which shows the non-overlapping portions of the conductor portions. As shown in FIG. 1B, A-A' direction represents the x-z plane, and B-B' direction represents the z-y plane. FIG. 3C illustrates the x-y cross-sectional view of a stair/level of staircase structure 102. FIG. 3D illustrates a detailed cross-sectional view of an exemplary conductor portion. FIGS. 3A-3D can also represent the cross-sectional views of staircase structure 202-1/202-2 along the same directions (as shown in FIG. 2B), except that the bridge structure may have a different number of conductor/dielectric layer pairs along the z-direction.

As previously described, in a 3D memory device, a staircase structure may include a staircase and a bridge structure in contact with the staircase. As shown in FIGS. 3A and 3B, the staircase structure may include a staircase 306 and a bridge structure 308 (only a portion depicted in FIG. 3B) in contact with staircase 306. The staircase structure may be formed over a substrate 302, similar to that in 3D memory device 100. An insulating structure 350 may be over at least staircase 306 such that at least staircase 306 is positioned in insulating structure 350. A word line VIA contact 316 may be formed in insulating structure 350 and landed on the landing area of a respective stair. For ease of illustration, only one word line VIA contact 316 is depicted. Insulating structure 350 may include any suitable dielectric material such as silicon oxide, silicon nitride, and/or silicon oxynitride. Word line VIA contact 316 may include tungsten, cobalt, copper, aluminum, polysilicon, doped silicon, silicides, or any combination thereof. Bridge structure 308 may include interleaved a plurality of conductor layers 330 and dielectric layers 336, similar to those in 3D memory device 100.

As shown in FIGS. 3A and 3B, staircase 306 includes a plurality of stairs 314 extending along the x-direction, e.g., the word line direction. Each stair 314 may have a different depth along the z-direction. In some embodiments, except for the top stair, staircase 306 includes a conductor portion 320 at the top surface of at least one stair 314 and electrically and physically connected to a conductor layer 330 at the same level in bridge structure 308. In some embodiments, each stair 314 in staircase 306 may include a respective conductor portion 320. Conductor portion 320 may be in contact with a dielectric portion 324 (e.g., extending along the x-direction) of the same level. Optionally, in a respective stair 314, conductor portion 320 may be on and in contact with another dielectric portion, which is on and in contact with a dielectric layer 326 underneath. In some embodiments, in a respective stair 314, conductor portion 320 may be on and in contact with dielectric layer 326 without any other dielectric portion in between. In some embodiments, each dielectric layer 326 in staircase 306 is in contact with a dielectric layer 336 at the same level in bridge structure 308. In some embodiments, conductor portion 320 may be over more than one dielectric layer 336 in the respective stair 314.

As shown in FIG. 3A, along the x-direction, conductor portion 320 extends in the landing area of the respective stair 314. The non-overlapping portion (shown in FIG. 3D) of conductor portion 320 may be cut off (e.g., not extending into) at the edge of an upper stair 314 (e.g., an immediately-above stair 314). That is, along the x-direction, little or no overlap is formed between the non-overlapping portions of adjacent conductor portions 320. In some embodiments, along the x-direction, no overlap is formed between the non-overlapping portion of any conductor portion 320. In some embodiments, along the x-direction, a width d of the non-overlapping portion of conductor portion 320 may be equal to or less than the dimension of stair 314. A respective word line VIA contact may be formed on the non-overlapping portion of conductor portion 320.

In some embodiments, in stair 314, dielectric portion 324 and the other dielectric portion (if formed) may have the same material(s), which is different from the material(s) of dielectric layer 326. In some embodiments, dielectric layer 326 includes silicon oxide. In some embodiments, dielectric portion 324 includes silicon nitride. In some embodiments, the other dielectric portion (if formed) has the same dimension along the x-direction as conductor portion 320. In stair 314, bottom surfaces of dielectric portion 324 and the other dielectric portion may be coplanar along the z-direction. Along the z-direction, a thickness of conductor portion 320 may be equal to or less than that of dielectric portion 324, and a thickness of the other dielectric portion (if formed) may be less than that of dielectric portion 324.

As shown in FIG. 3B, along the y-direction, a length D of conductor portion 320 may be equal to or less than the dimension of the respective stair 314. In some embodiments, length D is equal to the dimension of the respective stair 314 along the y-direction. In some embodiments, length D is less than the dimension of respective stair 314, and a second dielectric portion 323 is formed at the end of stair 314 away from bridge structure 308. Second dielectric portion 323 may have the same thickness as dielectric portion 324 along the z-direction, and may have the same material as dielectric portion 324. Along the x-direction, a width of second dielectric portion 323 may be less than, equal to, or greater than width d of conductor portion 320. Length D and width d of conductor portion 320 may each be sufficiently large to cover the landing area of the respective stair 314 and allow a respective word line VIA contact 316 to be formed at a desired location.

As shown in FIGS. 3A and 3B, conductor portion 320 may be over at least a respective dielectric layer 326 in the same stair 314. In some embodiments, in each stair 314, conductor portion 320 is in contact with and on the respective dielectric layer 326. Meanwhile, dielectric portion 324 may extend in staircase 306, e.g., along the x-direction (e.g., along the negative x-direction), from the boundary with the respective conductor portion 320 to the boundary between staircase 306 and a memory array structure. In some embodiments, along the z-direction, at least one conductor portion 320 is over interleaved a plurality of dielectric layers 326 and dielectric portions 324. For example, the dielectric layers 326 may include the respective dielectric layer 326 in the same stair and one or more dielectric layers 326 in lower stairs 314. The dielectric portions 324 may include one or more dielectric portions 324 in lower stairs 314. In some embodiments, along the z-direction, the at least one conductor portion 320 is also over the other dielectric portion in the same stair 314. As shown in FIG. 3A, all the dielectric portions 324 and dielectric layers 326 underlying conductor portion 320 may be referred to as a dielectric structure 340, of which a thickness along the z-direction is equal to the distance between the bottom surface of the respective conductor portion 320 and the top surface of substrate 302. In some embodiments, a length of dielectric structure 340, along the y-direction, is equal to that (e.g., length D) of conductor portion 320. In some embodiments, a width of dielectric structure 340, along the x-direction, is equal to that (e.g., width d) of conductor portion 320. In some embodiments, except for the bottom stair 314 (e.g., stair 314 at the bottom of staircase 306), dielectric structure 340 includes at least one pair of dielectric portion 324 and dielectric layer 326 corresponding to a lower stair 314 (e.g., stair 314 at a lower elevation/greater depth along the negative z-direction). In some embodiments, except for the bottom stair 314, each dielectric structure 340 includes at least one pair of dielectric portion 324 and dielectric layer 326 corresponding to a lower stair 314, and the dielectric layer 326 in the respective stair 314.

FIG. 3C illustrates a lateral cross-sectional view of the staircase structure, showing the spatial relationships of a GLS 310, conductor layer 330, conductor portion 320, and dielectric portion 324. As shown in FIGS. 3B and 3C, in some embodiments, staircase 306 includes a connecting structure 321 in contact with bridge structure 308. Connecting structure 321, being a part of staircase 306 and extending along the x-direction, may include interleaved at least one conductor strip and at least one dielectric strip over substrate 302. In some embodiments, a length L of connecting structure 321, along the y-direction, is equal to or greater than zero. For a respective stair 314, the dimension of connecting structure 321, along the x-direction, may be the length of the respective dielectric layer 326 (e.g., the sum of dielectric portion 324 and width d of conductor portion 320). That is, along the x-direction, the dimension of connecting structure 321 may be the same as the length of the contact region between stair 314 and bridge structure 308. The thickness of connecting structure 321 along the z-direction may be the same as the height of the respective stair 314. That is, the thickness of connecting structure 321 may be equal to the distance from the top surface of stair 314/conductor portion 320 to the top surface of substrate 302. Each conductor strip may be in contact with conductor layer 330 and dielectric portion 324 of the same level, and each dielectric strip may be in contact with dielectric layer 336 and dielectric layer 326 of the same level. The material(s) of the conductor strip may be the same as that of conductor layer 330, and the material(s) of the dielectric strip may be the same as that of dielectric layer 336.

For a respective stair 314, the top conductor strip may also be in contact with the respective conductor portion 320, thus electrically connecting conductor portion 320 and conductor layer 330 of the same level. Along the z-direction, the thickness of each conductor strip may be the same as that of the respective conductor layer 330. In some embodiments, conductor and dielectric strips, being a part of staircase 306, can be regarded as extensions of conductor layers 330 and dielectric layers 336 along they-direction and into staircase 306. In some embodiments, of a respective stair 314, dielectric structure 340 is in contact with the respective connecting structure 321.

As shown in FIG. 3C, GLS 310 may extend along the x-direction and be in contact with bridge structure 308 (e.g., or conductor layers 330 in bridge structure 308). In some embodiments, bridge structure 308 may be between GLS 310 and staircase 306. In some embodiments, along the negative y-direction, width d of conductor portion 320 may decrease. In various embodiments, along the negative y-direction, width d may keep decreasing by a first distance d1 (e.g., from the boundary of bridge structure 308 or connecting structure 321 (if any)) and stay unchanged by a second distance d2. As shown in FIG. 3C, the sum of d1 and d2 may be equal to D, if no connecting structure 321 is formed, and may be equal to (D-L), if connecting structure 321 is formed. In some embodiments, d1 is desirably small such that it may be negligible compared to d2. For example, d1 may be about 2% to about 20% (e.g., 2%, 3%, 5%, 8%, 10%, 15%, 18%, 20%) of d2.

FIG. 3D illustrates a detailed structure of conductor portion 320. For ease of illustration, different patterns/shades are used in FIG. 3D to depict various portions of conductor portion 320. In some embodiments, conductor portion 320 may be divided into a non-overlapping portion 320-1 and overlapping portions 320-2 and 320-3. Overlapping portion 320-2 may represent the portion of conductor portion 320 overlapping with the immediately-above stair (or the conductor portion 320 of the immediately-above stair) along the z-direction. Overlapping portion 320-3 may represent the portion of conductor portion 320 overlapping with the immediately-below stair (or the conductor portion 320 of the immediately-below stair) along the z-direction. Non-overlapping portion 320-1 may represent the portion of conductor portion 320 that has no overlap with any upper or lower stairs. Non-overlapping portion 320-1 and overlapping portion 320-3 may together form the portion of conductor portion 320 exposed on the top surface of stair 314. The boundary between overlapping portion 320-2 and non-overlapping portion 320-1, although not physically formed, may be the edge of the immediately-above stair 314. As shown in FIGS. 3C and 3D, non-overlapping portion 320-1 is in contact with each of overlapping portions 320-2 and 320-3. The total area of conductor portion 320 may then be the sum of non-overlapping portion 320-1 and overlapping portions 320-2 and 320-3, along the x-y plane.

In some embodiments, overlapping portions 320-2 and 320-3 may have nominally the same shape and/or nominally the same dimensions. In some embodiments, as shown in FIG. 3C, overlapping portion 320-2 has a right-triangle shape, in which the right angle is formed by the edge of the immediately-above stair 314 and the boundary of dielectric portion 324 along the x-direction. The lateral dimension of overlapping portion 320-2 may gradually decrease along the negative y-direction. In some embodiments, the boundaries of dielectric portion 324 may include the hypotenuse of the right-triangle (e.g., overlapping portion 320-2) as well as the boundaries along the y-direction (e.g., aligned with the edge of the immediately-above stair 314) and along the x-direction (e.g., with connecting structure 321 or bridge structure 308). In some embodiments, non-overlapping portion 320-1 may have a right-angle trapezoid shape. The lateral dimension of non-overlapping portion 320-1 may increase along the negative y-direction. That is, width d of conductor portion may decrease and stay unchanged along the negative y-direction.

Figure 4A:
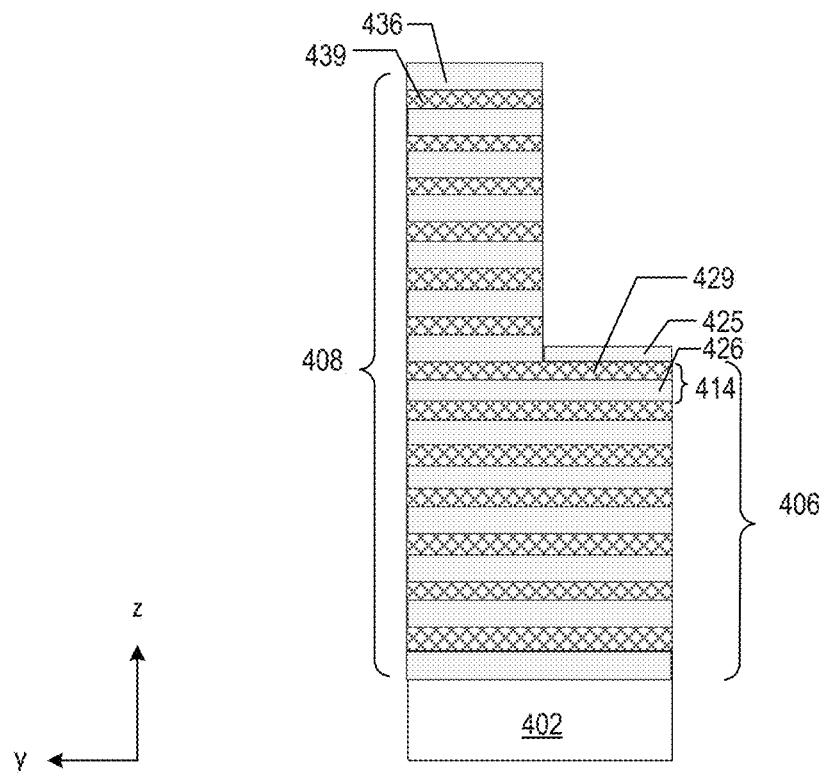
FIGS. 4A-4E illustrate a fabrication process for forming an exemplary staircase structure of a 3D memory device, according to some embodiments of the present disclosure.
Figure 4B:
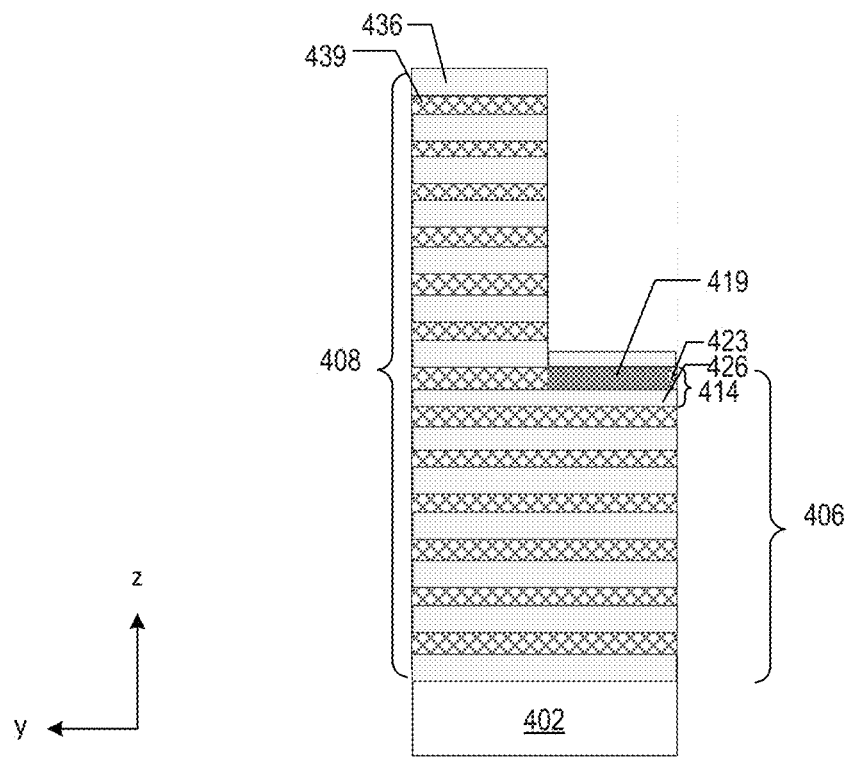
Figure 4C:
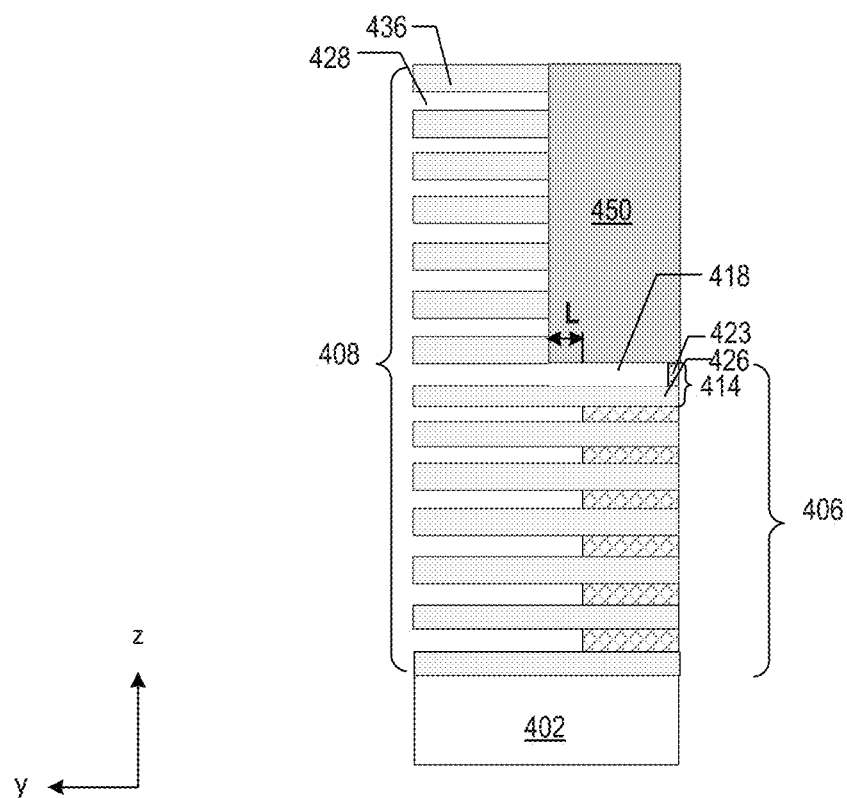
Figure 4D:
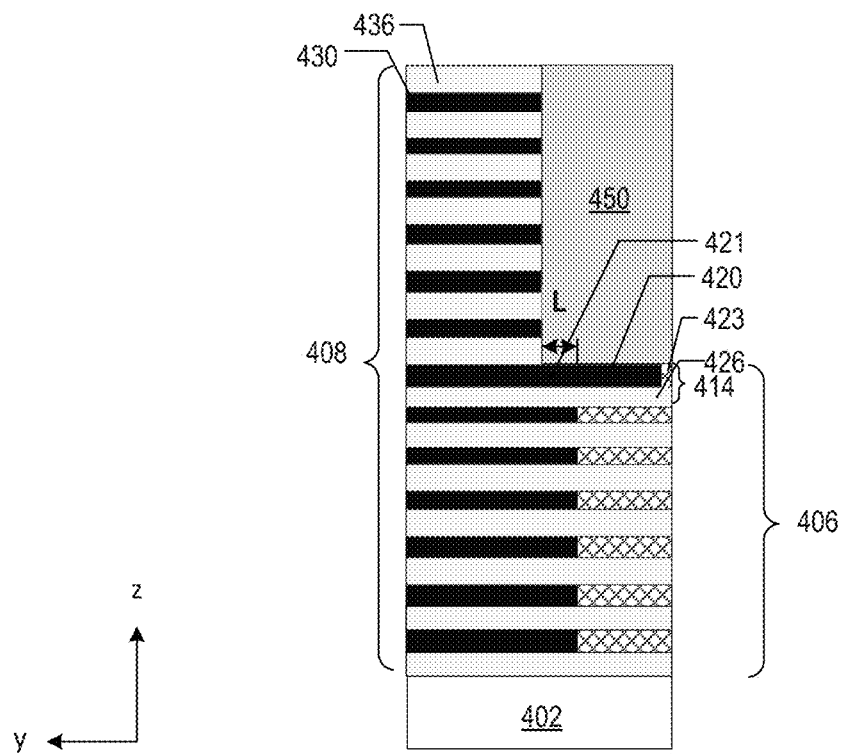
Figure 5A:
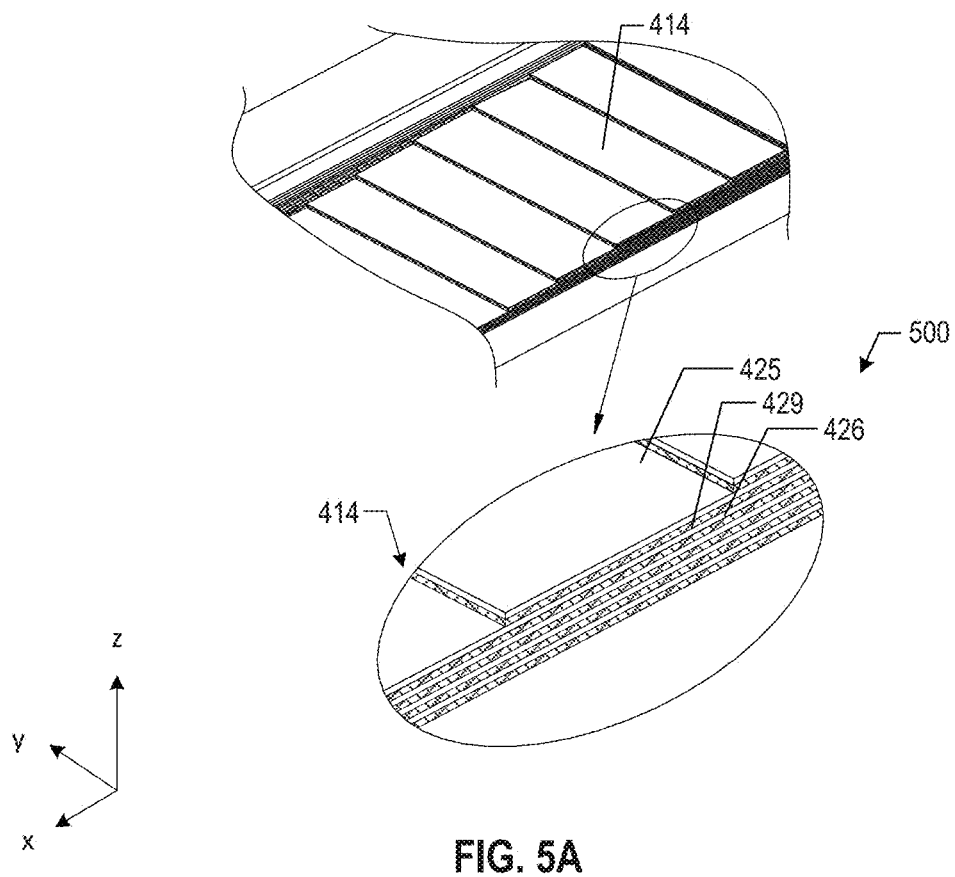
FIGS. 5A and 5B illustrate an exemplary staircase before and after an ion implantation process, according to some embodiments.
Figure 5B:
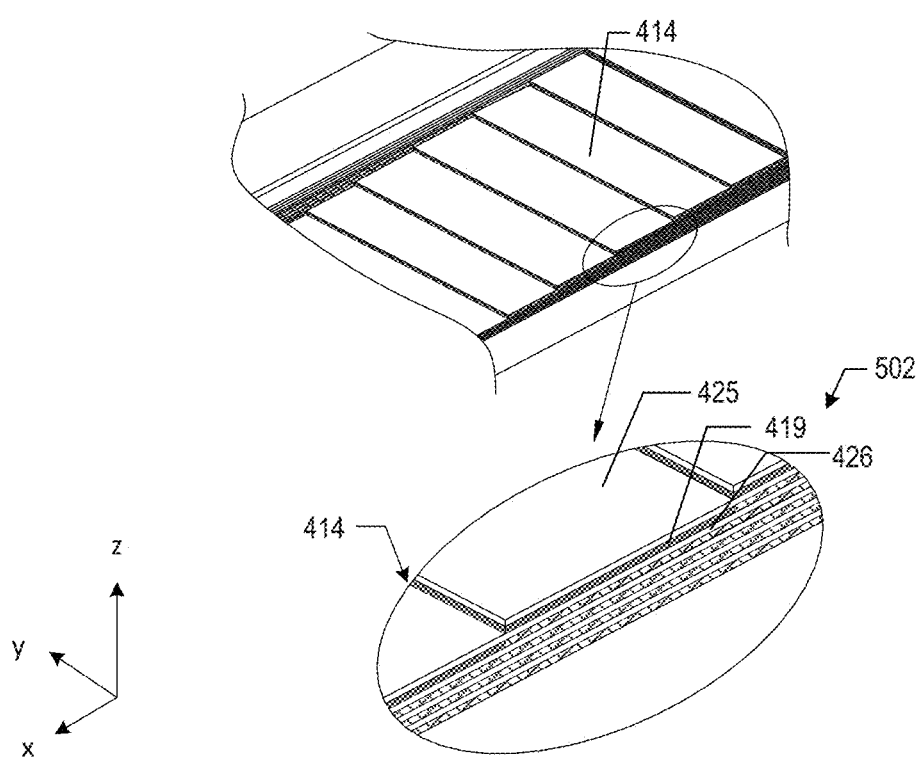
Figure 6:
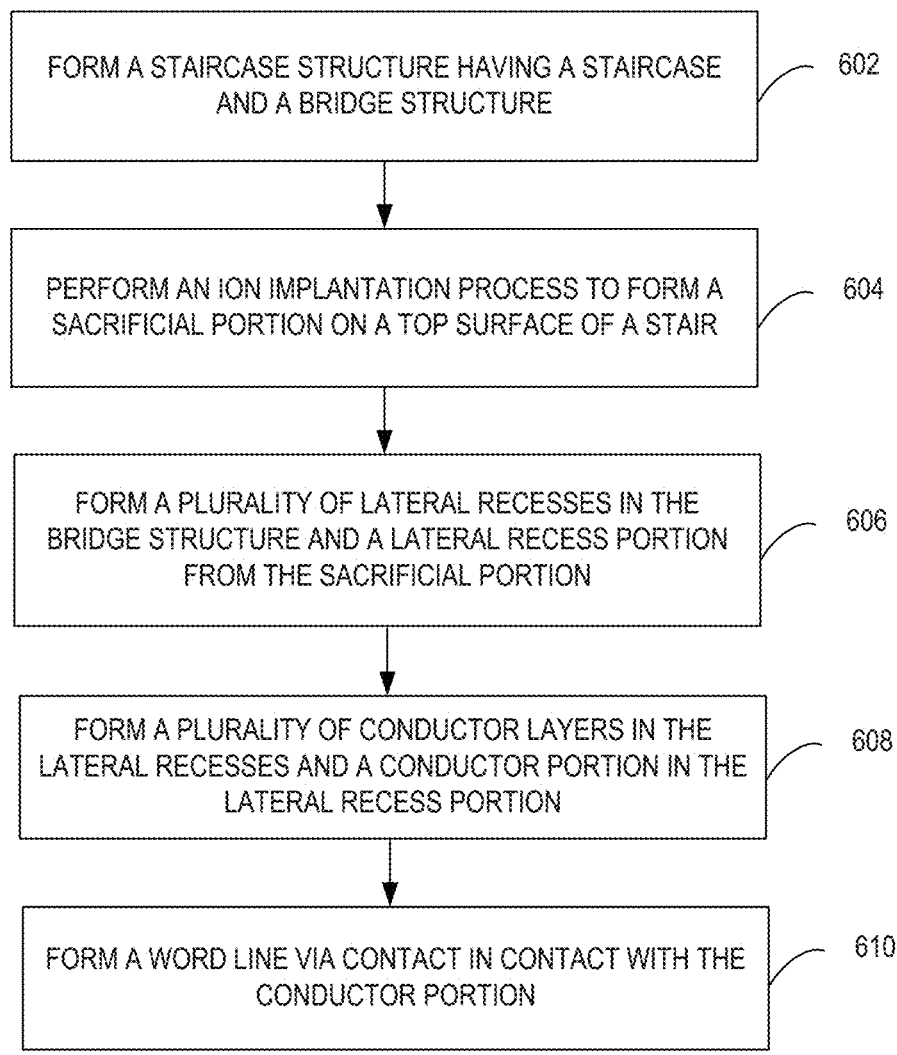
FIG. 6 is a flowchart of a method for forming an exemplary staircase structure of a 3D memory device, according to some embodiments.

FIGS. 4A-4D illustrate a fabrication process for forming an exemplary staircase structure of a 3D memory device, according to various embodiments of the present disclosure. FIGS. 5A and 5B illustrate a staircase before and after an ion implantation process, according to some embodiments. FIG. 6 is a flowchart of a method 600 for forming an exemplary staircase structure of a 3D memory device, according to some embodiments. It is understood that the operations shown in method 600 are not exhaustive and that other operations can be performed as well before, after, or between any of the illustrated operations. Further, some of the operations may be performed simultaneously, or in a different order than shown in FIG. 6.

Referring to FIG. 6, method 600 starts at operation 602, in which a staircase structure having a staircase and a bridge structure is formed. FIG. 4A illustrates a corresponding structure.

As shown in FIG. 4A, a staircase structure having a staircase 406 and a bridge structure 408 is formed over a substrate 402. Staircase 406 may be in contact with bridge structure 408. Staircase 406 may include interleaved a plurality of sacrificial layers 429 and a plurality of dielectric layers 426, forming a plurality of stairs 414 extending along the x-direction (e.g., referring to stairs 314 in FIG. 3A). Each stair 414 may include at least one pair of sacrificial layer 429/dielectric layer 426. Bridge structure 408 may include interleaved a plurality of sacrificial layers 439 and a plurality of dielectric layers 436. In some embodiments, each sacrificial layer 439 is in contact with a respective sacrificial layer 429 of the same level, and each dielectric layer 436 is in contact with a respective dielectric layer 436 of the same level. In some embodiments, sacrificial layers 439 and 429 include the same material, such as silicon nitride. In some embodiments, dielectric layers 436 and 426 include the same material, such as silicon oxide.

To form the stack structure, a material stack may first be formed. The material stack may include vertically interleaved first dielectric material layers and second dielectric material layers. In some embodiments, the material stack is a dielectric stack, and the first material layers and the second material layers include different dielectric materials. Interleaved first dielectric material layers and second dielectric material layers can be alternatingly deposited above substrate 402. In some embodiments, first dielectric material layers include layers of silicon nitride, and second dielectric material layers include layers of silicon oxide. The material stack can be formed by one or more thin film deposition processes including, but not limited to, chemical vapor deposition (CVD), physical vapor deposition (PVD), atomic layer deposition (ALD), or any combination thereof.

A portion of the material stack may be patterned to form the stack structure. In some embodiments, separate masks, e.g., separate etching processes, can be used to form staircase 406 and bridge structure 408. The formation of staircase 406, in some embodiments, includes repetitive etching of the material stack using an etch mask (e.g., a patterned photoresist or PR layer) over the material stack. The etch mask can be repetitively trimmed inwardly and incrementally, often from all directions, to expose the portions of the material stack to be etched. The amount of trimmed PR can be directly related (e.g., determinant) to the dimensions of the stairs. For example, the amount of trimmed PR along the x-direction may determine the width of stair 414 along the x-direction. The trimming of the PR layer can be obtained using a suitable etch, e.g., isotropic etch such as a wet etch. One or more PR layers can be formed and trimmed consecutively for the formation of the stairs. In some embodiments, the etching of the material stack, e.g., using a suitable etching process such as dry etch and/or wet etch, follows the trimming of the PR layer. In some embodiments, the material stack is etched by a stair depth along the z-direction following each trimming of the PR layer. The stair depth may be equal to the number of dielectric material layer pairs (e.g., the number of first dielectric material layer/second dielectric material layer) included in a stair. In some embodiments, the number of dielectric material layer pairs is one. The trimming process of a photoresist mask, followed by the etching process of a material stack, is referred to herein as a trim-etch cycle. The number of trim-etch cycles can determine the number of stairs formed in the material along the y-axis. In some embodiments, after the formation of stairs, the first dielectric material layers may form sacrificial layers 429, and the second dielectric material layers may form dielectric layers 426. Staircase 406 may be formed. In some embodiments, each stair 414 includes a pair of sacrificial layer 429 and an underlying dielectric layer 426 (e.g., one sacrificial/dielectric pair).

In various embodiments, bridge structure 408 can be formed by patterning another portion of the material stack. An etch mask may or may not be used, depending on the design of bridge structure 408. In various embodiments, bridge structure 408 may have the "wall-shape" structure as shown in FIG. 1B, or a staircase shape as shown in FIG. 2B. Bridge structure 408 may be formed with staircase 406 by the same etching process or by a different etching process. In some embodiments, the formation of bridge structure 408 includes a photolithography process followed by a suitable etching process, such as dry etch and/or wet etch. The staircase structure, having staircase 406 and bridge structure 408, may be formed.

In some embodiments, sacrificial layer 429 is exposed at the top surface of the respective stair 414, after the formation of staircase 406. In each stair 414, dielectric layer 426 may be under sacrificial layer 429. In some embodiments, as shown in FIG. 4A, a protection layer 425 can be formed on the top surface of stair 414 to provide buffering and protection during the subsequent ion implantation process on stairs 414 such that the underlying sacrificial layer 429 can have the optimized physical properties. Protection layer 425 may cover at least the portion of stair 414 (i.e., sacrificial layer 429) that is to undergo the ion implantation process. For example, protection layer 425 may cover at least the landing area (or possible landing area) of stair 414 (e.g., sacrificial layer 429). Protection layer 425 may include any suitable material with a suitable thickness along the z-direction and may be formed with any suitable methods. In some embodiments, protection layer 425 includes a layer of dielectric material(s). In some embodiments, protection layer 425 includes a part of the second dielectric material layer (e.g., silicon oxide) that is not fully etched away during the formation of stairs 414. That is, at least a portion of second dielectric material layer immediately above the first dielectric material layer in staircase 406 may be retained during the etching of the material stack. In some embodiments, the etch time to form stairs 414 is controlled to ensure protection layer 425 has a desired thickness. In some embodiments, protection layer 425 can also be formed by a suitable deposition process, e.g., CVD, ALD, and/or PVD, alone or in addition to the controlled etching, to deposit a layer of dielectric material(s), such as silicon oxide, on stairs 414 (i.e., sacrificial layers 429).

FIG. 5A illustrates an enlarged view 500 of stairs 414 before the ion implantation process. As shown in FIG. 5A, in some embodiments, sacrificial layer 429 in each stair 414 may be covered by protection layer 425, which includes the entire layer of second dielectric material immediately above sacrificial layer 429. In some embodiments, before the ion implantation process, stair 414 includes a protection layer 425 and an underlying sacrificial layer 429. Dielectric layer 426 may be underlying the respective sacrificial layer 429 and in contact with protection layer 425 of the immediately-below stair 414.

Referring to FIG. 6, method 600 proceeds to operation 604, in which an ion implantation process is performed to form a sacrificial portion on the top surface of the respective stair. FIG. 4B illustrates a corresponding structure.

As shown in FIG. 4B, an ion implantation process can be performed to form a sacrificial portion 419 on the top surface of at least one stair 414. In some embodiments, a plurality of sacrificial portions 419 are formed, each on a respective stair 414. Sacrificial portion 419 may cover at least the landing area of the respective stair 414. In some embodiments, sacrificial portion 419 covers the full width d (e.g., along the x-direction, referring back to FIG. 3A) of the respective stair 414. Sacrificial portion 419 may be cut off at the edge of the immediately-above stair 414, such that sacrificial portion 419 does not extend under upper stair 414 along the x-direction. In various embodiments, sacrificial portion 419, having a length D, may or may not cover the full length (e.g., along the y-direction, referring back to FIG. 3B) of the respective stair 414. Sacrificial portion 419 may or may not be cut off at the boundary between bridge structure 408 and staircase 406, depending on the ion implantation process. Along the z-direction, a thickness of sacrificial portion 419 may be less than or equal to the thickness of sacrificial layer 429. In some embodiments, the thickness of sacrificial portion 419 is equal to the thickness of sacrificial layer 429.

The ion implantation may change the physical properties of the treated portion of sacrificial layer 429 (i.e., sacrificial portion 419). In some embodiments, sacrificial portion 419 may be bombarded by the ions to have higher porosity such that, in the subsequent gate-replacement process, an etchant to remove sacrificial layers 429 may have a higher etch rate on sacrificial portion 419 over sacrificial layers 429. That is, the etchant to remove sacrificial layers 429 may selectively etch sacrificial portion 419 over sacrificial layers 429. In some embodiments, sacrificial portion 419 has a lower density than sacrificial layers 429, making it easier to be etched. In some embodiments, the ratio between the etch rate on sacrificial portion 419, and the etch rate on sacrificial layer 429 may be about 3:1. In various embodiments, the ion implantation process employs a tilted ion implantation process, at any suitable energy and with suitable ions. In some embodiments, the tilted ion implantation process may also implant ions into bridge structure 408. In some embodiments, the ions include boron (B) ions. Optionally, thermal treatment, such as an annealing process, can be performed after the ion implantation.

In some embodiments, the portion of sacrificial layer 429 that does not undergo the ion implantation process and under upper stairs 414 (referring back to FIG. 3A), may form a dielectric portion in the respective stair 414. The dielectric portion may be in contact with sacrificial portion 419 at the edge of the immediately-above stair 414. In some embodiments, if the thickness of sacrificial portion 419 is less than the thickness of sacrificial layer 429, an initial other dielectric portion (not shown) is formed under sacrificial portion 419. The initial other dielectric portion may be formed by the portion of sacrificial layer 429 under sacrificial portion 419 and not undergone the ion implantation process. In some embodiments, a width of the initial other dielectric portion along the x-direction is the same as the respective sacrificial portion 419, and a thickness of the initial other dielectric portion along the z-direction is less than that of the respective dielectric portion (or sacrificial layer 429). In some embodiments, a length of the initial other dielectric portion along the y-direction may be equal to that of conductor portion 420 (e.g., length D). In some embodiments, along the z-direction, each stair 414 includes sacrificial portion 419 and at least the underlying dielectric layer 426 (and the initial other dielectric portion, if formed). Further, except for the bottom stair 414, each stair 414 may be over one or more pairs of dielectric portion and dielectric layer 426 of lower stairs 414.

Optionally, sacrificial portion 419 may not fully cover stair 414 along the y-direction, and a second dielectric portion 423 may be formed from the portion of sacrificial layer 429 outside of the portion undergone the ion implantation process. In some embodiments, a width of second dielectric portion 423 along the x-direction may be less than, equal to, or greater than that of the respective stair 414 (e.g., width d). In some embodiments, a thickness of second dielectric portion 423 along the z-direction may be equal to or less than that of the respective sacrificial layer 429.

FIG. 5B illustrates an enlarged view 502 of stairs 414 after the ion implantation process. As shown in FIG. 5B, sacrificial portion 419 may be formed in each stair 414, underlying a respective protection layer 425. Sacrificial portions 419 of adjacent stairs 414 may have no overlap along any direction. Optionally, protection layer 425 may be removed after the ion implantation process to expose the underlying sacrificial portion 419. In some embodiments, a suitable etching process, e.g., dry etch and/or wet etch, is performed to remove protection layer 425. Dielectric layer 426 of each stair 414 may thus be cut off at the edge of the respective stair 414. In some embodiments, protection layer 425 is retained.

Referring to FIG. 6, method 600 proceeds to operation 606, in which a plurality of lateral recesses are formed in the bridge structure, and a lateral recess portion is formed from each sacrificial portion. FIG. 4C illustrates a corresponding structure.

As shown in FIG. 4C, a plurality of lateral recesses 428 may be formed in bridge structure 408, and a lateral recess portion 418 may be formed from a respective sacrificial portion 419. In some embodiments, a GLS (e.g., a slit structure, referred back to GLS 310 in FIG. 3C) may be formed in contact with bridge structure 408 before the formation of lateral recesses 428 and lateral recess portion 418. The GLS may extend in the staircase structure in the x-z plane, exposing substrate 402 and sacrificial/dielectric pairs (439/436) in bridge structure 408. A etching process, employing a suitable etchant, such as phosphoric acid, can be used to remove sacrificial layers 439 and sacrificial portions 419 through the GLS. In some embodiments, the etching process includes an isotropic etching process such as a wet etch. The etchant removes all sacrificial layers 439 exposed on the sidewalls of the GLS as well as sacrificial portions 419 in the same etching process, e.g., simultaneously. Dielectric layers 436 may be retained. Lateral recesses 428 may be formed from the removal of sacrificial layers 439, and lateral recess portion 418 may be formed from the removal of sacrificial portion 419.

In some embodiments, if protection layer 425 is removed before the etching process, the respective lateral recess portion 418 is exposed on the top surface of respective stair 414. In some embodiments, if protection layer 425 is retained, lateral recess portion 418 is formed underlying the respective protection layer 425. In some embodiments, lateral recess portion 418 is in contact with second dielectric portion 423 laterally (along the negative y-direction). In some embodiments, lateral recess portion 418 is in contact with the underlying dielectric layer 426.

In some embodiments, the etchant has a higher etch rate on sacrificial portion 419 over sacrificial layers 439. The ratio of the etch rate on sacrificial portion 419 over sacrificial layers 439 may be in a range of about 5:1 to about 2:1. In some embodiments, the ratio is approximately 3:1. Because the etchant approaches staircase 406 from the GLS, a portion of the dielectric portion may be over etched as a result of the higher etch rate on sacrificial portion 419. The over-etched portion of the dielectric portion may overlap with the immediately-above stair 414 and corresponds to an overlapping portion (e.g., referring back to overlapping portion 320-2 in FIG. 3D) of the subsequently-formed conductor portion. The over-etched portion may be a part of lateral recess portion 418. In some embodiments, the etch time is controlled such that at least a desired portion (e.g., a desired length along the y-direction) of the dielectric materials under each lateral recess portion 418 is retained. The retained dielectric materials under lateral recess portion 418 may form a respective dielectric structure under (e.g., referring back to FIG. 3A) the landing area on which a respective word line VIA contact is to be formed.

In some embodiments, a portion of staircase 406 under sacrificial portion 419 may be removed in the etching process. As shown in FIG. 4C, the removed portion of staircase 406 may include portions of the dielectric portions and portions of dielectric layers 426 (e.g., in lower stairs 414) under sacrificial portion 419. In some embodiments, the removed portion of staircase 406 may nominally have a length L along the y-direction and have the same length as sacrificial layer 429 along the x-direction. In some embodiments, if, along the z-direction, the thickness of sacrificial portion 419 is less than that of sacrificial layer 429, the etchant also removes a portion of each initial other dielectric portion, forming a respective other dielectric portion in contact and under lateral recess portion 418.

In some embodiments, an insulating structure 450 is formed over the staircase structure before the etching process such that at least staircase 406 is in insulating structure 450. Insulating structure 450 may include a suitable dielectric material and deposited by any suitable deposition method(s) such as CVD, ALD, and/or PVD. In some embodiments, insulating structure 450 includes silicon oxide and is deposited by CVD. In some embodiments, if protection layer 425 is removed before the formation of insulating structure 450, the dielectric material may be deposited to be in contact with sacrificial portion 419, forming insulating structure 450. In some embodiments, if protection layer 425 is retained, the deposited dielectric material may accumulate on protection layer 425. Insulating structure 450 may then include protection layer 425 and any deposited dielectric material thereon. It should be noted that insulating structure 450 can be formed at any suitable time after the formation of staircase 406 and before the formation of the word line VIA contacts. The specific timing to form insulating structure 450 should not be limited by the embodiments of the present disclosure.

Referring to FIG. 6, method 600 proceeds to operation 608, in which a plurality of conductor layers are formed in the lateral recess, and a conductor portion is formed in the respective lateral recess portion. FIG. 4D illustrates a corresponding structure.

As shown in FIG. 4C, a plurality of conductor layers 430 may be formed in bridge structure 408, and a conductor portion 420 may be formed in the respective stair 414 in staircase 406. In some embodiments, a suitable deposition process, such as ALD, CVD, and/or PVD, is performed to deposit a suitable conductor material to fill up lateral recesses 428 and lateral recess portion 418 in the same process. The conductor material may fill lateral recesses 428 and lateral recess portion 418 from the GLS. The over-etched portion of a respective lateral recess portion 418 may be filled with the conductor material to form an overlapping portion of conductor portion 420 underlying the immediately-above stair 414. The other portion of lateral recess portion 418 may be filled with the conductor material to form the non-overlapping portion and the other overlapping portion (e.g., referring back to non-overlapping portion 320-1 and overlapping portion 320-3, respectively, in FIG. 3D), both being on the top surface of the respective stair 414. In some embodiments, the conductor material may also fill the removed portion of staircase 406 under sacrificial portion 419 (or conductor portion 420), forming connecting structure 421 (referring back to FIG. 3C). The conductor material may include tungsten, cobalt, copper, aluminum, polysilicon, doped silicon, silicides, or any combination thereof.

Figure 4E:
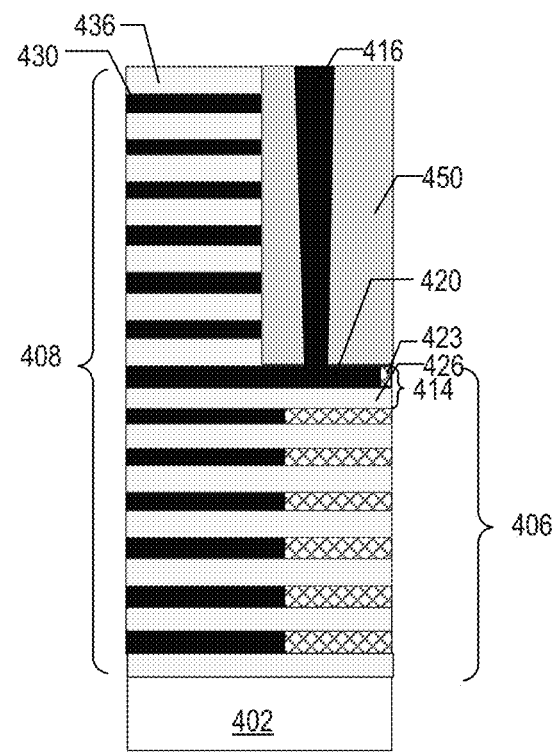

Referring to FIG. 6, method 600 proceeds to operation 610, in which a word line VIA contact is formed in contact with the respective conductor portion. FIG. 4E illustrates a corresponding structure.

As shown in FIG. 4E, a word line VIA contact 416 is formed in insulating structure 450 and in contact with the respective conductor portion 420. In some embodiments, word line VIA contact 416 is formed on the non-overlapping portion of the respective conductor portion 420. Word line VIA contact 416 may be formed by patterning insulating structure 450 to form an opening that exposes conductor portion 420 and depositing a suitable conductive material to fill in the opening. In some embodiments, the patterning of insulating structure 450 includes a photolithography process followed by a suitable etching process, e.g., dry etch and/or wet etch. The conductive material includes tungsten, cobalt, copper, aluminum, polysilicon, doped silicon, silicides, or any combination thereof. In some embodiments, an ACS is formed in the GLS after conductor layers 430 and conductor portions 420 are formed.

Embodiments of the present disclosure provide a 3D memory device. The 3D memory device includes a memory array structure and a staircase structure. The staircase structure is located in an intermediate of the memory array structure and divides the memory array structure into a first memory array structure and a second memory array structure along a lateral direction. The staircase structure includes a plurality of stairs extending along the lateral direction, and a bridge structure in contact with the first memory array structure and the second memory array structure. The plurality of stairs includes a stair above one or more dielectric pairs. The stair includes a conductor portion on a top surface of the stair and in contact with and electrically connected to the bridge structure, and a dielectric portion at a same level and in contact with the conductor portion. The stair is electrically connected to at least one of the first memory array structure and the second memory array structure through the bridge structure. Along a second lateral direction perpendicular to the lateral direction and away from the bridge structure, a width of the conductor portion decreases.

In some embodiments, a portion of the conductor portion overlaps with an upper stair.

In some embodiments, a lateral dimension of the portion of the conductor portion decreases along the second lateral direction.

In some embodiments, the portion of the conductor portion has a lateral shape of a right triangle.

In some embodiments, the stair further includes a dielectric layer under the conductor portion and the dielectric portion.

In some embodiments, the conductor portion and the dielectric layer is each above the one or more dielectric pairs.

In some embodiments, along the lateral direction, a width of another portion of the conductor portion is equal to a dimension of the stair.

In some embodiments, along the second lateral direction, a length of the conductor portion is equal to or less than a second dimension of the stair.

In some embodiments, a thickness of the conductor portion is equal to or less than a thickness of the dielectric portion along a vertical direction.

In some embodiments, the conductor portion includes at least one of tungsten, cobalt, copper, aluminum, silicides, and polysilicon. In some embodiments, the dielectric portion includes silicon nitride. In some embodiments, the dielectric layer includes silicon oxide.

In some embodiments, the bridge structure includes interleaved a plurality of conductor layers each in contact with the first and second memory array structures. In some embodiments, the conductor portion is in contact with and electrically connected to a respective conductor layer at the same level.

In some embodiments, each of the one or more dielectric pairs includes a dielectric portion and a dielectric layer corresponding to a lower stair.

Embodiments of the present disclosure provide a 3D memory device. The 3D memory device includes a memory array structure and a landing structure in contact with the memory array structure. The landing structure includes a plurality of landing areas each at a respective depth extending along a lateral direction, and a bridge structure in contact with the memory array structure. The plurality of landing areas each includes a conductor portion on a respective top surface and a dielectric portion at a same level and in contact with the conductor portion. The conductor portion is electrically connected to the memory array structure through the bridge structure. A width of the conductor portion decreases along a second lateral direction perpendicular to the lateral direction and away from the bridge structure. The plurality of landing areas are each above one or more dielectric pairs.

In some embodiments, a portion of the conductor portion overlaps with an upper landing area.

In some embodiments, a lateral dimension of the portion of the conductor portion decreases along the second lateral direction.

In some embodiments, the portion of the conductor portion has a lateral shape of a right triangle.

In some embodiments, the plurality of landing areas further includes a dielectric layer under the conductor portion and the dielectric portion.

In some embodiments, the conductor portion and the dielectric layer is each above the one or more dielectric pairs.

In some embodiments, along the lateral direction, a width of another portion the conductor portion is equal to a dimension of the respective landing area.

In some embodiments, along the second lateral direction, a length of the conductor portion is equal to or less than a second dimension of the respective landing area.

In some embodiments, the landing structure includes a plurality of stairs extending the lateral direction. In some embodiments, each of the plurality of landing areas is on the top surface of the respective stair.

In some embodiments, a thickness of the conductor portion is equal to or less than a thickness of the dielectric portion along a vertical direction.

In some embodiments, the conductor portion includes at least one of tungsten, cobalt, copper, aluminum, silicides, and polysilicon. In some embodiments, the dielectric portion includes silicon nitride. In some embodiments, the dielectric layer includes silicon oxide.

In some embodiments, the bridge structure includes interleaved a plurality of conductor layers each in contact with the memory array structure. In some embodiments, the conductor portion is in contact with and electrically connected to a respective one of the second conductors at the same level.

In some embodiments, each of the one or more dielectric pairs includes a dielectric portion and a dielectric layer corresponding to a lower landing area.

Embodiments of the present disclosure provide a 3D memory device. The 3D memory device includes a memory array structure and a staircase structure. The staircase structure includes a plurality of stairs extending along a lateral direction. The plurality of stairs includes a stair having a conductor portion on a top surface of the stair and a dielectric portion at a same level and in contact with the conductor portion. The conduction portion is electrically connected to the memory array structure. Along a second lateral direction perpendicular to the lateral direction, a width of the conductor portion varies.

In some embodiments, a portion of the conductor portion overlaps with an upper stair.

In some embodiments, a lateral dimension of the portion of the conductor portion decreases along the second lateral direction.

In some embodiments, the portion of the conductor portion has a lateral shape of a right triangle.

In some embodiments, the staircase structure further includes a dielectric layer under the conductor portion and the dielectric portion.

In some embodiments, the conductor portion and the dielectric layer are each above the one or more dielectric pairs.

In some embodiments, along the lateral direction, a width of another portion of the conductor portion is equal to a dimension of the stair.

In some embodiments, along the second lateral direction, a length of the conductor portion is equal to or less than a second dimension of the stair.

In some embodiments, a thickness of the conductor portion is equal to or less than a thickness of the dielectric portion along a vertical direction.

In some embodiments, the conductor portion includes at least one of tungsten, cobalt, copper, aluminum, silicides, and polysilicon. In some embodiments, the dielectric portion includes silicon nitride. In some embodiments, the dielectric layer include silicon oxide.

In some embodiments, the 3D memory device further includes a bridge structure in contact with the staircase structure and the memory array structure. The bridge structure includes interleaved a plurality of conductor layers each in contact with the memory array structure. The conductor portion is in contact with and electrically connected to one of the conductor layers at the same level. The staircase structure is electrically connected to the memory array structure through the bridge structure.

In some embodiments, each of the one or more dielectric pairs includes a dielectric portion and a dielectric layer corresponding to a lower stair.

Embodiments of the present disclosure provide a method for forming a staircase structure of a 3D memory device. The method includes the following operations. First, a plurality of stairs are formed having interleaved a plurality of first sacrificial layers and a plurality of first dielectric layers in a plurality of stairs. A bridge structure is formed in contact with the plurality of stairs, the bridge structure having interleaved a plurality of second sacrificial layers and a plurality of second dielectric layers. Each first sacrificial layer is in contact with a respective second sacrificial layer of the same level, and each first dielectric layer is in contact with a respective second dielectric layer of the same level. A sacrificial portion is formed in the first sacrificial layer corresponding to at least one of the stairs. The sacrificial portion is at a top surface of the respective stair and being cut off at an edge of an upper stair. The second sacrificial layers and the sacrificial portion are removed by a same etching process to respectively form a plurality of lateral recesses and a lateral recess portion. A plurality of conductor layers are formed in the lateral recesses and a conductor portion is formed in the lateral recess portion and in contact with a respective one of the conductor layers.

In some embodiments, the method further includes forming a dielectric portion in the respective first sacrificial layer. The sacrificial portion is in contact and at a same level with the sacrificial portion.

In some embodiments, in the etching process, an etch rate on the sacrificial portion is higher than an etch rate on the second sacrificial layers.

In some embodiments, a ratio of etch rate on the sacrificial portion over the etch rate on the second sacrificial layers is approximately 3:1.

In some embodiments, forming the lateral recess portion further includes removing, by the etching process, a portion of the dielectric portion under the upper stair.

In some embodiments, forming the sacrificial portion includes performing an ion implantation process on an exposed portion of the first sacrificial layer of the at least one of the stairs to alter an etch rate of the exposed portion of the first sacrificial layer in the etching process.

In some embodiments, the ion implantation process includes a tilted ion implantation process with boron (B).

In some embodiments, the method further includes forming a protection layer on the first sacrificial layer before the ion implantation process.

In some embodiments, the method further includes removing the protection layer after the ion implantation process.

In some embodiments, the method further includes retaining a portion of the first sacrificial layers and first dielectric layers corresponding to a lower stair under the sacrificial portion.

In some embodiments, the method further includes removing, by the etching process, another portion of the first sacrificial layers and the first dielectric layers under the sacrificial portion.

In some embodiments, the method further includes forming a slit structure in the staircase structure and removing the plurality of second sacrificial layers and the sacrificial portion through the slit structure.

In some embodiments, forming the plurality of conductor and the conductor portion includes depositing a conductor material to fill in the lateral recesses and the lateral recess portion.

In some embodiments, the method further includes forming a contact on the conductor portion.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory array structure; and
   a staircase structure in an intermediate of the memory array structure and dividing the memory array structure into a first memory array structure and a second memory array structure along a lateral direction, the staircase structure comprising a plurality of stairs extending along the lateral direction, and a bridge structure in contact with the first memory array structure and the second memory array structure, wherein
   a stair of the plurality of stairs comprises a conductor portion on a top surface of the stair and in contact with and electrically connected to the bridge structure, and a dielectric portion at a same level and in contact with the conductor portion, the stair being electrically connected to at least one of the first memory array structure and the second memory array structure through the bridge structure; and
   in the lateral direction, the conductor portion comprises a portion overlapping with an immediately-upper stair and in contact with the dielectric portion and the bridge structure.

2. The 3D memory device of claim 1, wherein a dimension of the portion of the conductor portion is less than a dimension of the conductor portion in a second lateral direction perpendicular to the lateral direction.

3. The 3D memory device of claim 1, wherein the conductor portion comprises a second portion overlapping with an immediately-lower stair.

4. The 3D memory device of claim 3, wherein the portion and the second portion of the conductor portion each has a lateral shape of a right triangle.

5. The 3D memory device of claim 3, wherein the conductor portion comprises a third portion not overlapping with a neighboring stair.

6. The 3D memory device of claim 5, wherein the third portion has a lateral shape of a right-angle trapezoid.

7. The 3D memory device of claim 1, wherein a length of the conductor portion is less than a length of the dielectric portion in a second lateral direction perpendicular to the lateral direction.

8. The 3D memory device of claim 1, wherein:
   the conductor portion comprises at least one of tungsten, cobalt, copper, aluminum, silicides, or polysilicon; and
   the dielectric portion comprises silicon nitride.

9. The 3D memory device of claim 1, wherein the stair further comprises a dielectric layer underlying and in contact with the conductor portion and the dielectric portion, the dielectric layer comprising silicon oxide.

10. The 3D memory device of claim 1, wherein:
    the bridge structure comprises a plurality of conductive layers, each of the conductive layers is in contact with the first memory array structure and the second memory array structure; and
    the conductor portion is in contact with and conductively connected to a respective conductive layer of a same level.

11. The 3D memory device of claim 10, wherein:

the conductor portion comprises at least one of tungsten, cobalt, copper, aluminum, silicides, or polysilicon; and the dielectric portion comprises silicon nitride.

12. A three-dimensional (3D) memory device, comprising:

a memory array structure; and a staircase structure comprising a plurality of stairs extending along a first lateral direction, the plurality of stairs comprising a stair comprising a conductor portion on a top surface of the stair and a dielectric portion at a same level and in contact with the conductor portion, the conduction portion being electrically connected to the memory array structure, wherein along a second lateral direction perpendicular to the first lateral direction, a width of the conductor portion decreases.

13. The 3D memory device of claim 12, wherein the conductor portion comprises a portion overlapping with an immediately-upper stair and in contact with the dielectric portion and a bridge structure connected with the memory array structure.

14. The 3D memory device of claim 13, wherein the conductor portion comprises a second portion overlapping with an immediately-lower stair.

15. The 3D memory device of claim 14, wherein the portion and the second portion of the conductor portion each has a lateral shape of a right triangle.

16. The 3D memory device of claim 14, wherein the conductor portion comprises a third portion not overlapping with a neighboring stair.

17. A method for forming a staircase structure of a three-dimensional (3D) memory device, comprising:

forming interleaved a plurality of sacrificial layers and a plurality of dielectric layers, each of the sacrificial layers comprises a first sacrificial layer and a second sacrificial layer in contact with each other, each of the dielectric layers comprises a first dielectric layer and a second dielectric layer in contact with each other;

forming a plurality of stairs comprising the interleaved plurality of first sacrificial layers and plurality of first dielectric layers;

forming a sacrificial portion in the first sacrificial layer corresponding to at least one of the stairs, the sacrificial portion being at a top surface of the respective stair;

removing, by a same etching process, the second sacrificial layers and the sacrificial portion to respectively form a plurality of lateral recesses and a lateral recess portion; and forming a plurality of conductor layers in the lateral recesses, and a conductor portion in the lateral recess portion and in contact with a respective one of the conductor layers.

18. The method of claim 17, further comprising forming a dielectric portion in the respective first sacrificial layer, the sacrificial portion being in contact and at a same level with the sacrificial portion.

19. The method of claim 17, wherein in the etching process, an etch rate on the sacrificial portion is higher than an etch rate on the second sacrificial layers.

20. The method of claim 17, wherein forming the sacrificial portion further comprises:

performing an ion implantation process on an exposed portion of the first sacrificial layer of the at least one of the stairs to alter an etch rate of the exposed portion of the first sacrificial layer in the etching process.

* * * * *